(12) United States Patent
Chung

(10) Patent No.: US 11,972,340 B2
(45) Date of Patent: Apr. 30, 2024

(54) WEIGHT MEMORY DEVICE WITH VARIABLE CAPACITANCE, WEIGHT MEMORY SYSTEM, AND OPERATION METHODS THEREFOR

(71) Applicant: Kwangwoon University Industry-Academic Collaboration Foundation, Seoul (KR)

(72) Inventor: In Young Chung, Namyangju-si (KR)

(73) Assignee: KWANGWOON UNIV INDUSTRY-ACADEMIC COLLABORATION FDN, Seoul (KR)

( * ) Notice: Subject to any disclaimer, the term of this patent is extended or adjusted under 35 U.S.C. 154(b) by 912 days.

(21) Appl. No.: 17/009,066

(22) Filed: Sep. 1, 2020

(65) Prior Publication Data

US 2021/0064960 A1    Mar. 4, 2021

(30) Foreign Application Priority Data

Sep. 2, 2019    (KR) .......................... 10-2019-0108337

(51) Int. Cl.
```
G11C 16/16      (2006.01)
G06N 3/04       (2023.01)
G06N 3/063      (2023.01)
G11C 16/04      (2006.01)
H10B 43/27      (2023.01)
```
(52) U.S. Cl.
CPC .............. *G06N 3/04* (2013.01); *G06N 3/063* (2013.01); *G11C 16/0466* (2013.01); *H10B 43/27* (2023.02)

(58) Field of Classification Search
CPC .......... G06N 3/04; G06N 3/063; G06N 3/048; G11C 16/0466; G11C 11/404; H10B 43/27; H10B 41/27
See application file for complete search history.

(56) References Cited

U.S. PATENT DOCUMENTS

| | | | |
|---|---|---|---|
| 5,039,870 A | 8/1991 | Engeler | |
| 5,039,871 A | 8/1991 | Engeler | |
| 2017/0352750 A1 | 12/2017 | Lee et al. | |
| 2019/0171933 A1 | 6/2019 | Lee et al. | |
| 2019/0303750 A1* | 10/2019 | Kumar | .................. G06F 7/5443 |

FOREIGN PATENT DOCUMENTS

| | | |
|---|---|---|
| KR | 10-2017-0138047 A | 12/2017 |
| KR | 10-2019-0065145 A | 6/2019 |
| KR | 10-2019-0066400 A | 6/2019 |
| WO | 2019-093724 A1 | 5/2019 |

* cited by examiner

*Primary Examiner* — Xiaochun L Chen
(74) *Attorney, Agent, or Firm* — United One Law Group LLC; Kongsik Kim; Jhongwoo Peck

(57) ABSTRACT

Disclosed are a weight memory device capable of supporting artificial neural network operation and a weight memory system using the same. A weight memory device according to an embodiment of the present invention includes: an input terminal; a common output terminal; and charge storage disposed between the input terminal and the common output terminal, and configured to store charge. In this case, the capacitance between the input terminal and the common output terminal is determined based on the amount of charge stored in the charge storage, and is quantified based on given data to be stored in the weight memory device.

19 Claims, 19 Drawing Sheets

WEIGHT MEMORY DEVICE WITH VARIABLE CAPACITANCE, WEIGHT MEMORY SYSTEM, AND OPERATION METHODS THEREFOR

CROSS-REFERENCE TO RELATED APPLICATION

This application claims under 35 U.S.C. § 119(a) the benefit of Korean Patent Application No. 10-2019-0108337 filed on Sep. 2, 2019, which is incorporated herein by reference.

TECHNICAL FIELD

The present invention relates generally to a weight memory device that is used in place of a synapse of a neural network in a neuromorphic system for imitating a neural network, a weight memory system, and operation methods. More particularly, the present invention relates to a weight memory device that is disposed in a cell array structure in which input and output terminals intersect each other and provides multiply-and-accumulate (MAC) operation optimized for artificial neural network operation in the cell array structure, a weight memory system, and operation methods.

BACKGROUND ART

Artificial intelligence is attracting attention as the core technology of the future industry along with the Internet of Things and big data. Machine learning that is a technology for enabling a machine system to evaluate and generalize data on its own without requiring individual code programming is a branch of artificial intelligence, and is being applied to various fields such as internet search, news category classification, translation, and image recognition.

Although machine learning is generally implemented through software, efforts are being made to implement machine learning in hardware form. These efforts started with systems that imitated the brain's neural network, and have been proposed as neuromorphic systems that attempt to perform artificial neural network operation by hardware rather than software.

When machine learning is implemented in an integrated circuit based on the von Neumann architecture, power consumption is considerably increased and also a heat generation problem becomes serious due to repetitive operations. Accordingly, numerous attempts have been made to implement machine learning using a neuromorphic scheme that imitates the nervous system of animals. In particular, in the technology imitating the nervous system of animals, it is possible to improve cognitive and judgment functions by enabling a cognitive function and learning while significantly reducing power consumption. Accordingly, there occur opportunities to replace or significantly improve the functions of the conventional von Neumann-type integrated circuit.

As an example of a neuromorphic system, there was disclosed Korean Patent Application Publication No. 10-2019-0066400 entitled "Multi-level Weight Device." In the conventional technology disclosed in Korean Patent Application Publication No. 10-2019-0066400, the resistance of a resistance change layer is changed according to the pattern of an applied pulse train by using a memristor as a memory cell, and a weight value to be stored in the memory cell is specified based on the change in the resistance.

In this scheme, voltage is used as input, and current is used as output. When the output currents of memory cells connected to the same data line are summed, multiply-and-accumulate (MAC) operation is naturally achieved. Accordingly, this scheme can reduce power consumption than a case where machine learning is implemented using the von Neumann architecture.

In the conventional technology disclosed in Korean Patent Application Publication No. 10-2019-0066400, when a memory cell storing a weight is used in an inference process of machine learning, a circuit that implements a function for transferring the output of each layer of an artificial neural network to a subsequent layer includes a capacitor for integration, and thus problems occur in that an area is increased and power consumption is also increased. In efforts to mitigate the firing of a transfer function, there were disclosed Korean Patent Application Publication No. 10-2017-0138047 entitled "Neuron-Mimicking Devices and Circuits" and Korean Patent Application Publication No. 10-2019-0065145 entitled "Nerve Mimic System."

In the conventional technology disclosed in Korean Patent Application Publication Nos. 10-2017-0138047 and 10-2019-0065145, although an attempt is made to reduce power consumption by imparting a firing function corresponding to a transfer function to each memory cell device, other synapses may be affected by a synapse in which firing occurs in its early stage in this process, and thus a problem arises in that control by a peripheral circuit is additionally required.

In the above conventional technologies, voltage is used as input, and current is used as output. Accordingly, during a readout process, high current flows, and power consumption is high. In order to control these factors, accurate timing control and timing control requiring consideration for influence on adjacent synapse devices are required. The output current is used, and thus DC current is basically generated, thereby increasing power consumption.

SUMMARY OF THE DISCLOSURE

Although the conventional neuromorphic technologies significantly reduce power consumption compared to artificial neural network configurations based on the von Neumann architecture, the conventional neuromorphic technologies use voltage as input and current as output. Accordingly, DC current continuously flows during a readout process, and this is known as a cause not to further reduce power consumption. In particular, when a multiply-accumulator (MAC) operation is performed based on current, the values of respective current components must be continuously maintained, and thus the respective current components must flow simultaneously. Accordingly, in this process, a problem arises in that power consumption is further increased. In addition, the detection processes of respective cells must be simultaneously performed, and thus a problem arises in that timing control is very difficult.

Furthermore, depending on the configuration of the neuromorphic system, a problem arises in that continuous operation is difficult because a weight stored once is deleted after one artificial neural network inference operation, or the like.

Moreover, the memristor process is not a commonly used process, and the peripheral circuit must be formed based on a general CMOS process. Accordingly, problems arise in that a manufacturing process is complicated and manufacturing cost is increased.

An object of the present invention is to propose a neuromorphic device, a weight memory device, a weight memory system, and operation methods that are optimized for artificial neural network operation by changing the structure of cells and operation methods while utilizing the conventional memory semiconductor process.

The present invention proposes a method of detecting a voltage difference, unlike the conventional technologies based on current, when outputting data of a weight memory cell, and an object of the present invention is to reduce power consumption without requiring constant DC current during a read operation of a neuromorphic system.

An object of the present invention is to propose a memory cell structure that supports built-in MAC operation capable of performing inter-layer propagation operation using weight values generated in artificial neural network operation at low cost in an array of memory cells that store weight values of synapses. An object of the present invention is to propose a weight memory structure that is optimized for artificial neural network operation capable of performing MAC operation immediately without another dedicated operation circuit.

An object of the present invention is to propose a weight memory cell structure that can facilitate the optimization and stabilization of a process of manufacturing a weight memory device and significantly increase the degree of integration by utilizing at least part of the conventional memory semiconductor process. In addition, an object of the present invention is to propose a weight memory cell structure that can reduce the area occupied by a circuit for reading data stored in a weight memory device in response to artificial neural network operation and can simplify the configuration of the data reading circuit, thereby increasing the overall degree of integration of a system including the array.

An object of the present invention is to propose a neuromorphic system that is capable of increasing the overall degree of integration of a system including an array and also performing artificial neural network operation rapidly through the three-dimensional stacking of weight memory cell arrays. In addition, an object of the present invention is to propose a new neuromorphic system that can easily implement the transfer characteristics of a data reading circuit in accordance with an inter-layer transfer function within an artificial neural network and can easily deal with the configurations of various artificial neural networks including a convolutional neural network (CNN) and a circulating neural network (RNN).

An object of the present invention is to propose a neuromorphic system that is capable of readjusting a stored weight value by applying a bias between the terminals of a weight memory cell device for a predetermined period or by adjusting the polarity and number of pulses, and accordingly being applied to a wide application range including not only an inference process but also a learning process.

According to an aspect of the present invention, there is provided a weight memory device including: an input terminal; a common output terminal; and charge storage disposed between the input terminal and the common output terminal, and configured to store charge. In this case, the capacitance between the input terminal and the common output terminal is determined based on the amount of charge stored in the charge storage, and is quantified based on given data to be stored in the weight memory device.

The common output terminal may be electrically connected to an interface circuit configured to drive and control a voltage of the common output terminal via a switch, and, when the common output terminal and the interface circuit are electrically cut off from each other by the switch, may be electrically isolated without being electrically connected to an intended charge leakage path.

The charge storage may include: a first dielectric layer disposed adjacent to the common output terminal; a second dielectric layer disposed adjacent to the input terminal; and a storage layer disposed between the first dielectric layer and the second dielectric layer, and made of one of a conductor, a semiconductor, and a dielectric capable of storing electrons or charges therein.

Each of the input terminal and the common output terminal may be at least one of a well disposed on a substrate, a semiconductor wire, an oxide semiconductor wire, and a metal wire. In this case, the semiconductor wire may include a polysilicon wire.

The input terminal may be at least one of a well disposed on a substrate, a semiconductor, an oxide semiconductor, and a metal. In this case the semiconductor may include polysilicon. The common output terminal may be at least one of a semiconductor wire, an oxide semiconductor wire, and a metal wire. In this case, the semiconductor wire may include a polysilicon wire.

A first bias voltage applied between the input terminal and the common output terminal and the length of a time period during which the first bias voltage is applied may be determined based on the given data. Furthermore, the amount of charge to be stored in the charge storage may vary depending on the first bias voltage and the length of the time period during which the first bias voltage is applied, and the capacitance-voltage characteristics between the common output terminal and the input terminal may be determined based on the amount of charge stored in the charge storage.

The capacitance between the input terminal and the common output terminal may be quantified based on the capacitance-voltage characteristics between the common output terminal and the input terminal and based on a second bias voltage in the state in which the second bias voltage has been applied between the input terminal and the common output terminal. Furthermore, when an input signal is applied to the input terminal in the state in which the second bias voltage has been applied, a change in a voltage or amount of charge of the common output terminal may be generated as an output signal of the common output terminal based on the capacitance between the input terminal and the common output terminal and the input signal.

The input terminal may be one of a well disposed on a substrate and a deposited semiconductor wire, and the common output terminal may be a gate terminal. The amount of charge to be stored in the charge storage may be determined in such a manner that electrons are trapped in the charge storage when a first bias voltage is applied between the input terminal and the common output terminal.

The weight memory device may further include a drain/source region disposed on a partial region of the well disposed on the substrate or the deposited semiconductor wire and configured to provide an auxiliary bias condition.

The auxiliary bias condition provided by the drain/source region may be a bias condition configured to supply electrons or holes to the surface of one of another partial region of the input terminal facing the common output terminal and another partial region of the common output terminal facing the input terminal so that when a second bias voltage is applied between the input terminal and the common output terminal, an output signal of the common output terminal based on the capacitance-voltage characteristics between the common output terminal and the input terminal is generated timely and efficiently in response to an input signal of the input terminal.

The auxiliary bias condition provided by the drain/source region may be a bias condition configured to block the formation of an electron layer or a hole layer on the interface of one of another partial region of the input terminal facing the common output terminal and another partial region of the common output terminal facing the input terminal so that when a first bias voltage or a second bias voltage is applied between the input terminal and the common output terminal, an output signal of the common output terminal based on the capacitance-voltage characteristics between the common output terminal and the input terminal is generated in response to an input signal of the input terminal.

The weight memory device may be a three-dimensional memory device, one of the input terminal and the common output terminal may be formed in a body that vertically extends on a substrate and includes a conductive region and a dielectric, the other one of the input terminal and the common output terminal may be a control gate terminal that surrounds at least part of the body, and the charge storage may be disposed between the body and the control gate terminal to store charge According to another aspect of the present invention, there is provided a weight memory system including: a first electrode arranged in a first direction, and configured to connect the common output terminal of the memory cells which are arranged in the first direction from among a plurality of memory cells; a second electrode arranged in a second direction different from the first direction, and configured to connect the input terminals of the memory cells which are arranged in the second direction from among the plurality of memory cells; a first memory cell disposed to correspond to a location at which the first electrode and the second electrode intersect each other, specified by the intersection of the first electrode and the second electrode, and configured such that the first electrode is connected to a first common output terminal thereof and the second electrode is connected to a first input terminal thereof; a first interface circuit configured to drive and control a voltage of the first electrode or to sense a change in the voltage or amount of charge of the first electrode and generate an output transfer signal; and a first driving circuit configured to drive and control a voltage of the second electrode.

In this case, the first memory cell may include charge storage disposed between the first input terminal and the first common output terminal and configured to store charge. The first capacitance between the first input terminal and the first common output terminal may be determined based on the amount of charge stored in the charge storage, and may be quantified based on first data given to the first memory cell to be stored in the first memory cell.

When the first interface circuit and the first electrode are electrically cut off from each other by the operation of the first interface circuit, the first electrode may be electrically isolated without being electrically connected to an intended charge leakage path.

When a first input signal is applied to the first input terminal via the second electrode by the first driving circuit, a first output signal component based on the first input signal and the first capacitance may output to the first electrode via the common output terminal.

The weight memory system may further include: a second memory cell connected to the first electrode via a second common output terminal thereof; a third electrode connected to the second input terminal of the second memory cell, and arranged in the second direction; and a second driving circuit configured to drive and control a voltage of the third electrode.

In this case, the second memory cell may be disposed to correspond to a location at which the first electrode and the third electrode intersect each other and be specified by the intersection of the first electrode and the third electrode, and the second capacitance of the second memory cell may be quantified based on second data given to the second memory cell to be stored in the second memory cell.

When a second input signal is applied to the second input terminal via the third electrode by the second driving circuit, a second output signal component based on the second input signal and the second capacitance may be output to the first electrode via the common output terminal. A sum output signal in which the first output signal component and the second output signal component are summed may be output to the first electrode, and the first interface circuit may detect the sum output signal and generate the output transfer signal.

When the first input signal is a change in a voltage of the input terminal, the first output signal component may be a first charge amount change component. In this case, the first output signal component may contribute to the change in the voltage or amount of charge of the first electrode via the common output terminal.

The first input signal and the output transfer signal may be designed to have the same physical dimension.

A first memory array including the first memory cell may store information corresponding to a synapse between the first layer and second layer of an artificial neural network. Furthermore, a second memory array may store information corresponding to a synapse between the second layer and third layer of the artificial neural network. Output transfer signals of the first memory array may be applied as input signals of the second memory array while maintaining a physical dimension.

According to still another aspect of the present invention, there is provided a method of operating a weight memory device, the method including: applying a first input signal to a first memory cell via the input terminal of the first memory cell storing given first data by forming a first capacitance quantified based on the first data; outputting a first charge amount change component based on the first input signal and the first capacitance via the first common output terminal of the first memory cell; and detecting, by a first interface circuit, a change in the voltage or amount of charge of the first common output terminal.

The method may further include: applying a second input signal to a second memory cell via the input terminal of the second memory cell storing given second data by forming a second capacitance quantified based on the second data; and outputting a second charge amount change component based on the second input signal and the second capacitance via the first common output terminal of the second memory cell.

The first memory cell and the second memory cell may be connected to the first common output terminal, and a sum output signal in which the first charge amount change component and the second charge amount change component are summed may be output to the common output terminal. The detecting a change in the voltage or amount of charge of the first common output terminal may include detecting, by the first interface circuit, the sum output signal formed in the first common output terminal and generating, by the first interface circuit, an output transfer signal.

The first input signal may be an activation parameter of a first node, which is one of nodes of a first layer of an artificial neural network. The first data may be a weight value between the first node and a second node, which is one of nodes of a second layer of the artificial neural network. The change in the voltage or amount of charge of the first common output terminal may be an activation parameter of the second node obtained based on the sum of the products of activation parameters of the nodes of the first layer and weight values corresponding to synapses between the nodes of the first layer and the second node.

According to still another aspect of the present invention, there is provided a method of operating a weight memory system, the method including: inputting activation parameters of the nodes of the first layer of the artificial neural network by applying input signals, corresponding to the activation parameters, for respective input terminals of a first array of a weight memory system such that the input signals for the respective input terminals of the first array are delivered respectively to memory cells of the first array that store weight data by forming capacitances quantified based on the weight data corresponding to synapses between the first layer of the first array and the second layer of the artificial neural network; causing a change in a voltage or amount of charge of a common output terminal of the first array, by summing charge amount change components based on the input signals and the capacitances in the common output terminal; and detecting, by an interface circuit of the first array, the change in the voltage or amount of charge of the common output terminal and generating, by the interface circuit of the first array, output transfer signals of the first array. In this case, the output transfer signals are activation parameters of the respective nodes of the second layer.

The method may further include applying the output transfer signals, which are the activation parameters of the nodes of the second layer of the artificial neural network, as input signals for input terminals of a second array of the weight memory system. In this case, the applying the output transfer signals as the input signals for the input terminals of the second array may include applying the output transfer signals as the input signals for the respective input terminals of the second array while maintaining the physical dimension of the output transfer signals. That is, the method can deliver the output transfer signals of the first array to the second array as input signals of the second array without converting the physical dimension of the output transfer signals of the first array.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE DISCLOSURE

Other objects and features of the present invention in addition to the above object will be apparent from the following description of embodiments with reference to the accompanying drawings.

Embodiments of the present invention will be described in detail below with reference to the accompanying drawings. In the following description, when it is determined that a detailed description of a related known component or function may unnecessarily make the gist of the present invention obscure, it will be omitted.

Figure 1:
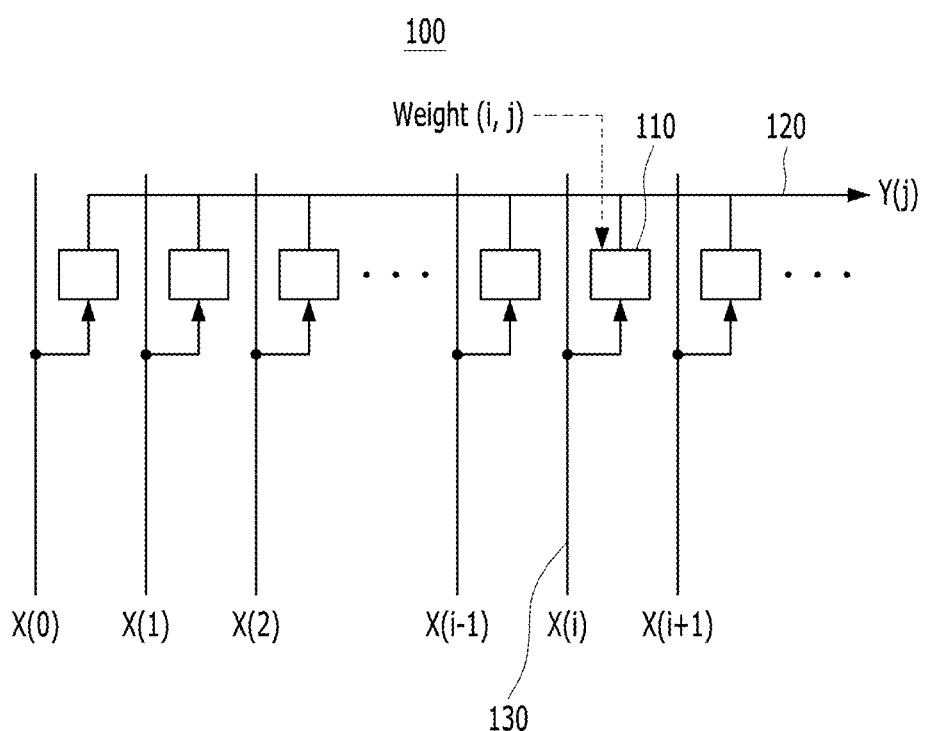
FIG. 1 is a diagram showing weight memory devices and a weight memory system according to an embodiment of the present invention.

FIG. 1 is a diagram showing weight memory devices and a weight memory system according to an embodiment of the present invention.

Referring to FIG. 1, there are shown weight memory devices 110 that form a single row in an array. Each of the weight memory devices 110 of FIG. 1 is connected to an input terminal 130 to which an input signal $X(i)$ ($i=0$ to $M-1$) is applied, and is also connected to a common output terminal 120 which outputs a composite output signal $Y(j)$ ($j=0$ to $N-1$). Each of the weight memory devices 110 of FIG. 1 stores weight data $Weight(i,j)$ corresponding to a synapse of an artificial neural network, and the weight data $Weight(i,j)$ is quantified as the value of the capacitance formed in each of the weight memory devices 110 of FIG. 1. In an embodiment, when the numbers of nodes of layers in an artificial neural network are the same, $M=N$. A MAC operation function is built in the weight memory devices 110 and weight memory system 100 of FIG. 1. Accordingly, when any input signal $X(i)$ ($i=0$ to $M-1$) is applied, a composite output signal $Y(j)$ is automatically generated, the composite output signal $Y(j)$ is detected by an interface circuit (not shown in FIG. 1), and an output transfer signal is generated as a detection result of the interface circuit.

Figure 2:
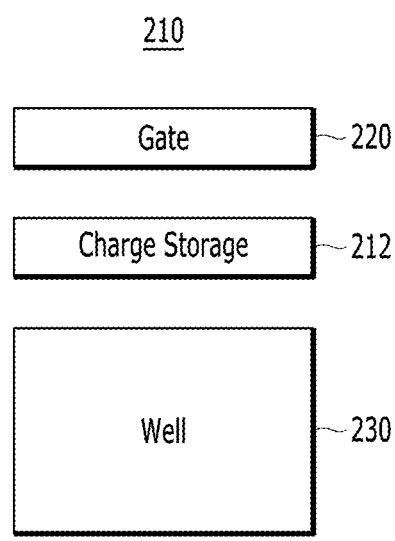
FIG. 2 is a diagram showing a weight memory device according to an embodiment of the present invention.

FIG. 2 is a diagram showing a weight memory device according to an embodiment of the present invention.

Referring to FIG. 2, a weight memory device 210 includes a common output terminal 220, charge storage 212, and an input terminal 230. The charge storage 212 is disposed between the input terminal 230 and the common output terminal 220, and may store charge.

The capacitance between the input terminal 230 and the common output terminal 220 is determined based on the amount of charge stored in the charge storage 212 under a specific bias condition and the capacitance is quantified based on given data, and thus the memory device 210 stores the given data. A write bias condition during a write operation of the weight memory device 210 and a time period during which the write bias condition is applied may be adjusted such that the capacitance between the input terminal 230 and the common output terminal 220 can be quantified based on the given data under a specific bias condition for reading data from the weight memory device 210.

In the weight memory device 210 according to an embodiment of the present embodiment, the input terminal 230 and/or the common output terminal 220 may be implemented using at least one of a well disposed on a substrate, a semiconductor wire, an oxide semiconductor wire, and a metal wire. In this case the semiconductor wire may include a polysilicon wire.

In the weight memory device 210 according to another embodiment of the present invention, the input terminal 230 may be implemented using at least one of a well disposed on a substrate, a semiconductor wire, and an oxide semiconductor wire, and the common output terminal 220 may be implemented using at least one of a polysilicon wire, a semiconductor wire, an oxide semiconductor wire, and a metal wire. However, when any one of the input terminal 230 and the common output terminal 220 is a metal wire, the remaining one may not be a metal wire.

In the embodiment of FIG. 2, a gate electrode may be used as the common output terminal 220, and a well may be used as the input terminal 230. The well used as the input terminal 230 may be electrically separated from an adjacent well. It is obvious that the spirit of the present invention is not limited to the embodiment of FIG. 2.

The charge storage 212 may be a floating gate, a floating cell, a charge trap, or a charge trap dielectric disposed between the common output terminal 220, i.e., a gate electrode, and the input terminal 230, i.e., a well. The configuration and composition of the charge storage 212 may be determined by considering whether a write bias voltage during a write operation, i.e., a programming operation, can be increased, whether decreasing write bias voltage is advantageous, and whether the device can withstand a high write bias voltage.

The charge storage 212 of the weight memory device 210 of FIG. 2 may include a first dielectric layer disposed adjacent to the common output terminal 220, a second dielectric layer disposed adjacent to the input terminal 230, and a storage layer disposed between the first dielectric layer and the second dielectric layer and made of a conductor, a semiconductor, or a dielectric capable of storing electrons or charges therein.

The input terminal 230 of the weight memory device 210 according to an embodiment of the present invention is a well or deposited semiconductor wire disposed on a substrate, and the common output terminal 220 is a gate terminal. When a first bias voltage (a programming bias voltage) is applied between the input terminal 230 and the common output terminal 220, electrons are trapped in the charge storage 212, and thus the amount of charge to be stored in the charge storage 212 may be determined.

Although not shown in FIG. 2, the weight memory device 210 according to an embodiment of the present invention may further include a drain/source region disposed on a well disposed on a substrate or a partial region of a deposited semiconductor wire. An auxiliary bias condition applied to the drain/source region may effectively support or inhibit the transfer of charges between the input terminal 230 and the common output terminal 220 timely and efficiently in combination with a write bias condition or read bias condition between the input terminal 230 and the common output terminal 220.

In this case, the bias applied to the drain/source region may be used to form an optimum capacitance-voltage (C-V) characteristic curve so that an intended amount of charge can be induced to the common output terminal 220 in response to an input signal (a small signal or small pulse signal) applied to the input terminal 230. For example, the source/drain bias may be set such that the input terminal 230 and the common output terminal 220 are blocked from each other by forming an inverted charge layer (or an inverted hole layer in the case where the P/N polarities of the semiconductor are reversed) on a dielectric/semiconductor interface (which is formed in an area where a channel region, and the input terminal 230 or the common output terminal 220 face each other, or which, in an embodiment, may be formed on any one of the input terminal 230 and the common output terminal 220) between the source and the drain, so that the capacitance between the two terminals is converged into zero. In another case, the source/drain bias may be set such that an inverted charge layer or inverted hole layer is not be formed regardless of the voltage between the input terminal 230 and the common output terminal 220, so that the capacitance continues to decrease as the voltage increases. These source/drain bias conditions may be modified and used for each of read and write operations of the weight memory device 210.

A semiconductor device having the input terminal 230, the common output terminal 220, and the charge storage 212 included in the embodiment of FIG. 2 may be used as the weight memory device 210 of the present invention. As representative embodiments, flash memory may be used as the weight memory device 210, and EEPROM, EPROM, or the like may also be used as the weight memory device 210.

However, the conventional flash memory uses a change in threshold voltage attributable to programming voltage, and detects an operating current using the change. In contrast, the weight memory device 210 of the present invention uses a phenomenon in which C-V characteristics are changed by programming voltage, and is characterized in that the capacitance value that the weight memory device 210 has under a specific bias condition during a read operation is applied as weight data.

Referring to the embodiments of FIGS. 1 and 2 together, the plurality of weight memory devices 110 or 210 connected to the one common output terminal 120 or 220 is shown as a unit based on which one read operation is performed. In the embodiments of FIGS. 1 and 2, each of the weight memory devices 110 or 210 of the present invention transfers a charge amount change component proportional to the input signal $X(i)$ and the capacitance value to the common output terminal 120 or 220, and a sum output signal $Y(j)$ in which charge change components transferred from the respective weight memory devices 110 or 210 are summed is formed in the common output terminal 120 or 220. The input signals X(i) input to the plurality of respective weight memory devices 110 or 210 connected to the one common output terminal 120 or 220 transfer charge amount change components to the common output terminal 120 or 220 in proportion to the capacitance values formed in the plurality of respective weight memory devices 110 or 210. Accordingly, it can be understood that the products of the input signals X(i) input to the plurality of respective weight memory devices 110 or 210 and the capacitance values formed in the plurality of respective weight memory devices 110 or 210 are summed and appear in the common output terminal 120 or 220. In this case, the MAC operation of the input signals X(i) and the capacitance values C(i,j) is automatically performed to form the sum output signal Y(j) of the common output terminal 120 or 220.

Since the weight memory devices 110 or 210 form an array, the input terminals 130 or 230 may be connected to the respective input terminals of other weight memory devices (not shown) that are connected to the common output terminal (not shown) of another row. However, the unit of a read operation may be seen as the weight memory devices 110 or 210 sharing the one common output terminal 120 or 220, and the weight memory devices 110 or 110, which are elements constituting the unit of a read operation, may be identified by checking whether they share the one common output terminal 120 or 220.

The voltage of the common output terminal 120 or 220 may be driven and controlled by an interface circuit. The voltage of the common output terminal 120 or 220 may be preset to an intended bias (a second bias) through a switch before and after a read operation in order to perform an elaborate read operation. However, when the read operation is in progress, the common output terminal 120 or 220 is not electrically connected to an intended charge leakage path, and thus the total amount of charge in this terminal is preserved. In this case, the common output terminal 120 or 220 is not electrically connected to the outside, but is in an electrically isolated topology state.

A case where the voltage of the common output terminal 120 or 220 is applied from the outside is a case where a programming operation, i.e., a write operation in which data is stored, is performed. In this case, a programming bias may be applied between the common output terminal 120 or 220 and the input terminal 130 or 230 by the interface circuit. When data storage is terminated and the connection between the interface circuit and the common output terminal 120 or 220 is released, the common output terminal 120 or 220 is electrically isolated. Even while input signals X(i)=$\Delta$VX(i) are applied to the input terminals 130 or 230 and the charge amount change components proportional to $\Delta$VX(i)*C(i,j) are transferred to the common output terminal 120 or 220, the common output terminal 120 or 220 remains electrically isolated. In this case, changes in the voltages of the input terminals 130 or 230 given by the input signals induce charge amount change components proportional to changes in the voltages and the capacitances of the respective weight memory devices 110 or 220 to the common output terminal 120 or 220.

The interface circuit may include a driving circuit configured to drive and control the voltage of the common output terminal 120 or 220 from the outside and a detection circuit configured to perceive and detect a change in the voltage or amount of charge of the common output terminal 120 or 220. In this case, in an embodiment of the present invention, the interface circuit may include a driving circuit and a detection circuit that are separate from each other. Alternatively, in an embodiment of the present invention, the interface circuit may be implemented such that a driving circuit and a detection circuit are integrated into a single circuit and both the operation of driving and controlling the voltage of the common output terminal 120 or 220 from the outside, i.e., a programming operation, and the operation of perceiving and detecting a change in the voltage or amount of charge of the common output terminal 120 or 220, i.e., a read operation, are performed by the single circuit. For example, when the common output terminal 120 or 220 is connected to the negative input terminal of an operational amplifier (op amp) and the positive input terminal of the op amp is connected to the ground, a minute change in the voltage of the common output terminal 120 or 220 may be amplified and detected by the op amp. In addition, in the case of a feedback configuration in which a capacitor is connected between the output terminal of the op amp and the common output terminal 120 or 220, a bias condition during a read operation may be adjusted based on the external voltage applied to the output terminal of the op amp and the voltage formed between both ends of the capacitor. The programming operation may be performed by a switch that connects the common output terminal 120 or 220 and an external high voltage. When an array of weight memory devices 110 or 210 is formed, the numbers of weight memory devices 110 or 210 and common output terminals 120 or 220 may be very large. Accordingly, the interface circuit directly connected to the common output terminals 120 or 220 may be advantageous when the number of wires is minimized. In an embodiment of the present invention, the output terminal of the op amp may be used as a supply line of a high voltage bias applied from the outside, in which case the switch may connect the output terminal of the op amp and the common output terminal 120 or 220.

In the case where the input terminal 130 or 230 is a separate well and the common output terminal 120 or 220 is a gate electrode, as shown in FIG. 2, when the input signal X(i)=$\Delta$VX(i) is applied to the input terminal 130 or 230, the amount of charge proportional to $\Delta$VX(i)*C(i,j) is induced to the common output terminal 120 or 220. Such charge amount change components may be summed for the plurality of weight memory devices 110 or 210 connected to the one common output terminal 120 or 220 to form one sum output signal Y(j).

Referring to FIGS. 1 and 2 together, a gate electrode connected to first electrodes arranged in a first direction may be referred to as the common output terminal 120 or 220. In this case, a first electrode corresponding to a j-th row may connect the common output terminal 120 or 220 of a plurality of memory cells/memory devices 110 or 210 arranged in the first direction.

Second electrodes arranged in a second direction different from the first direction and corresponding to an i-th column may connect the input terminals 130 or 230 of memory cells/memory devices 110 or 210 arranged in the second direction.

A specific first memory cell may be specified by an i-th column and a j-th row. In other words, the first memory cell may be disposed at a location at which the second electrode corresponding to the i-th column and the first electrode corresponding to the j-th row intersect each other. For example, a memory cell disposed closest to a location at which the second electrode and the first electrode intersect each other may be specified as the first memory cell. The weight data stored in the first memory cell is given by Weight(i,j) and quantified by C(i,j).

The weight memory system 100 may further include a first interface circuit that drives and controls the voltage of the first electrode or senses a change in the voltage or amount of charge of the first electrode and generates an output transfer signal Vout_Y(j). The first interface circuit may be an interface circuit corresponding to the first electrode, i.e., the j-th row.

The weight memory system 100 may further include a first driving circuit that drives and controls the voltage of the second electrode. The first driving circuit is a driving circuit corresponding to the second electrode, i.e., the i-th column.

When an input signal $X(i)=\Delta VX(i)$ is applied to the input terminal 130 or 230 of the first memory cell using the second electrode, a first output signal component (a charge amount change component) proportional to $\Delta VX(i)*C(i,j)$ is induced to the common output terminal 120 or 220, and the first output signal component is output to the first electrode of the j-th row through the common output terminal 120 or 220.

Another second memory cell may be specified by an (i+1)-th column and the j-th row. In other words, the second memory cell may be disposed at a location at which a third electrode arranged in the second direction and corresponding to an (i+1)-th column and the first electrode corresponding to the j-th row intersect each other. The weight data stored in the second memory cell is given by Weight(i+1,j) and quantified by C(i+1,j).

The weight memory system 100 may further include a second driving circuit that drives and controls the voltage of the third electrode. The second driving circuit may be a driving circuit corresponding to the third electrode, i.e., the (i+1)-th column.

When the input signal $X(i+1)=\Delta VX(i+1)$ is applied to the input terminals 130 or 230 of the second memory cell using the third electrode, a second output signal component (a charge amount change component) proportional to $\Delta VX(i+1)*C(i+1,j)$ is induced to the common output terminal 120 or 220, and the second output signal component is output to the first electrode of the j-th row through the common output terminal 120 or 220.

At the first electrode of the j-th row, the first output signal component transferred from the first memory cell in the i-th column and the second output signal component transferred from the second memory cell in the (i+1)-th column may be summed to form one sum output signal Y(j).

When the sum output signal Y(j) is expressed as a sum charge amount $\Delta QY(j)$ induced to the first electrode of the j-th row by applying the above process to M memory cells connected to the j-th row, $\Delta QY(j)=\Sigma[\Delta VX(i)*C(i,j)]$ (i=[0, M−1]) is obtained.

Depending on the embodiments, the weight memory devices 110 and 210 of the present invention may have a structure similar to that of a conventional NAND flash memory cell, and may have a structure similar to that of a MOS transistor or MOS capacitor. Meanwhile, if a variety of new memory devices that have been recently proposed, e.g., memory cell structures having a cross-point structure, have a characteristic capable of changing the capacitance between two terminals, may be implemented as the weight memory devices 110 or 210 of the present invention.

As another embodiment of the present invention based on FIG. 1, a deposited semiconductor wire may be used instead of the well, formed on a substrate as shown in FIG. 2, as the input terminal 130, a deposited semiconductor wire may be also used as the common output terminal 120 intersecting on another layer, and charge storage may be arranged between the two terminals. In this case, the separation (or electrical insulation) of the input terminal is easy, and thus the degree of integration may be considerably improved.

In this embodiment, as in the well on the substrate, a source/drain may be formed on the deposited semiconductor that is used as the input terminal 130 or common output terminal 120. Various semiconductor materials, such as oxide semiconductor materials and/or polysilicon, may be used for the deposited semiconductor. In this case, one of the input terminal 130 and the common output terminal 120 may be composed of a metal wire instead of the deposited semiconductor.

Each of the weight memory devices 110 and 210 of the present invention may be implemented using any device that satisfies the following characteristics. Each of the weight memory devices 110 and 210 of the present invention includes an input terminal capable of receiving an input signal from the outside, and a common output terminal capable of maintaining a state electrically isolated from the outside. Each of the weight memory devices 110 and 210 of the present invention has charge storage 212 between the input terminal 130 or 230 and the common output terminal 120 or 220. The amount of charge stored in the charge storage 212 determines the capacitance formed between the input terminal 130 or 230 and the common output terminal 120 or 220. The capacitance may also be determined by a read bias condition during a read operation and a C-V characteristic curve. The capacitance may also be affected by the read bias condition due to the C-V characteristic curve, so the capacitance should be read with a specified read bias condition depending on the embodiments of the present invention. It means the capacitance may be quantified considering the specified read bias condition in the embodiments of the present invention.

In other words, any device having a structure in which the C-V characteristic of the capacitance formed between the input terminal 130 or 230 and the common output terminal 120 or 220 may be changed by the amount of charge stored in the charge storage 212 and the capacitance formed between the input terminal 130 or 230 and the common output terminal 120 or 220 under a specific read bias condition can be quantified may be used as each of the weight memory devices 110 and 210 of the present invention.

Furthermore, not only non-volatile memory but also limited non-volatile memory (a memory device that can store and maintain data for a predetermined period but resets data after a long period of time) may be used as the weight memory devices 110 and 210 of the present invention. Even limited non-volatile memory in which weight data is implemented as a quantified capacitance value by a programming operation and the stored data can be maintained during the period in which the capacitance value and the weight data are utilized by a read operation may be used as the weight memory devices 110 and 210 of the present invention.

The amount of charge stored in the charge storage 212 may be transferred to or escaped from the charge storage 212 by various tunneling techniques known as hot electrons or F-N tunneling. The amount of charge stored in the charge storage 212 may be quantified by a programming bias condition applied between the input terminal 130 or 230 and the common output terminal 120 or 220 and a time period during which a programming bias is applied.

The common output terminal 120 or 220 is connected only to the gate terminal of an interface circuit (including a case where the interface circuit is a detection circuit and a case where the interface circuit is a circuit into which a driving circuit and a detection circuit are integrated) or the common output terminal (the gate in FIGS. 1 and 2) 120 or 220 of other memory devices in the same row with the exception of a switch connected when a voltage is preset before or after a read operation or when an external bias voltage is applied, and has no other electrical connection routes. Furthermore, even in a newly proposed memory cell structure such as a cross-point memory cell, the common output terminal 120 or 220 may be implemented as a conductor surrounded by an insulator, a semiconductor or an oxide semiconductor, the common output terminals 120 or 220 of weight memory devices 110 or 210 are connected by electrodes each composed of a conductor, a semiconductor or an oxide semiconductor, and the common output terminal 120 or 220 is connected only to another circuit or the gate terminal of a transistor with the exception of a switch that is a path through which a bias voltage is applied from the outside and has no other electrical connection routes.

The data stored by the respective weight memory devices 110 and 210 are weight data corresponding to synapses in which the nodes of the previous layer of the artificial neural network are associated with the respective nodes of a subsequent layer. A programming bias condition for each of the weight memory devices 110 and 210 and a time period during which the programming bias is applied are determined such that the capacitance formed in each of the weight memory devices 110 and 210 is quantified based on weight data, and a programming operation is performed.

The programming operation may be a write operation for the weight memory devices 110 and 210 in an empty state in which data is not stored, or may be an update operation for weight data already stored. In a neuromorphic system that is generally used only for inference, additional update is not necessarily required after storing weight data in the weight memory devices 110 and 210 in an empty state. However, in a neuromorphic system used for the learning/ training of an artificial neural network, there may be required an operation of updating weight data already stored. In order to update the weight data already stored, a programming bias condition may be subdivided, such that conditions, such as the polarity of an update programming bias and a time period, may be differently applied to each memory cell.

For example, when the bias condition applied in the direction in which the amount of charge accumulated in the charge storage 212 increases is + polarity and the bias condition applied in the direction in which the amount of charge accumulated in the charge storage 212 decreases is − polarity, a programming operation for the empty memory cell and an update programming operation for the weight data already stored may be performed by selectively combining pulses of + polarity and − polarity and applying it to the memory cell. As the pulses of + polarity and − polarity are selectively and repeatedly applied, the capacitance $C(i,j)$ stored in the weight memory device 110 or 210 may increase or decrease, and accordingly the weight data may increase or decrease.

When the capacitance $C(i,j)$ of an $(i,j)$-th weight memory device 110 or 210 in an array is quantified based on Weight$(i,j)$ and $X(i)=\Delta VX(i)$ proportional to the activation parameter (a feature map) of the i-th node of a previous layer is applied to the input terminal 130 or 230, the amount of charge proportional to $\Delta VX(i)*C(i,j)$ is induced to the common output terminal 120 or 220. In other words, information proportional to the product of the activation parameter of the node of the previous layer and the weight data is transferred to the common output terminals 120 and 220 as a charge amount change component. The activation parameters of the nodes of the previous layer, i.e., $X(i)$ (i=0 to M−1), are combined with the capacitance $C(i,j)$ proportional to the weight data, and a resulting value is transferred to the common output terminal 120 or 220. A sum output signal $Y(j)$ in which charge amount change components are summed is formed at the common output terminal 120 or 220. The sum output signal $Y(j)$ incorporates a change in the voltage or amount of charge of the common output terminal 120 or 220 thereinto, and is a result of the MAC operation of the activation parameters of the nodes of the previous layer and the weight data.

As in the embodiment of FIG. 2, the weight memory devices 110 and 210 of the present invention are based on a structure similar to that of the conventional flash memory cell, and charges are accumulated in the charge storage 212 between the gate electrode and the well by the interaction between a gate electrode and a well bias electrode. As charges are accumulated in the charge storage 212, the capacitance $C(i,j)$ of the $(i,j)$-th semiconductor device (the weight device) formed by the gate electrode and the well is changed. The weight device stored in the corresponding memory cell is represented by the capacitance $C(i,j)$ of the MOS Cap formed based on the accumulated charges. However, individual well biases require independent control, and thus the wells of weight devices in different columns to which the input terminals 130 or 230 correspond should be separated from each other. A triple well structure may be applied in this process. If the input terminals 130 or 230 are also implemented using deposited polysilicon instead of the wells on substrate as in the embodiment of FIG. 12, the electrical separation between these wells is not required.

In each of the weight memory devices 110 and 210 according to an embodiment of the present invention, the process of sequentially accumulating charges in the charge storage between the gate electrode and the well may be implemented in a manner similar to the method of subdividing and performing the program process of the conventional flash memory cell. Accordingly, this is advantageous that it can be easily operated using a modification of the existing semiconductor process and a modification of the existing semiconductor operation method.

In this case, the first bias voltage (the programming bias voltage) between the input terminal 130 or 230 and the common output terminal 120 or 220 and the length of the time period during which the first bias voltage is applied may be determined based on the data to be stored in the weight memory devices 110 or 210, i.e., given data.

Furthermore, the amount of charge to be stored in the charge storage 212 is changed according to the first bias voltage and the length of the time period during which the first bias voltage is applied, and the C-V Characteristics between the common output terminal 120 or 220 and the input terminal 130 or 230 may be determined based on the amount of charge to be stored in the charge storage 212 and the polarity of the amount of charge.

The greatest feature of the weight memory devices 110 and 210 according to an embodiment of the present invention is that unlike the conventional flash memory cell structure, during reading, a well bias may be used as an input and a gate electrode may be used as an output. In this process, by applying the differential voltage $\Delta VX(i)$ to the well bias in the i-th column using timing control, it is combined with the capacitance $C(i,j)$ of each weight device and the differential charge $\Delta QY(j)=\Sigma C(i,j)*\Delta VX(i)$ accumulated in the gate electrode of the j-th row may be cumulatively calculated.

The differential output voltage ΔVY(j) of the gate electrode of the j-th row may be obtained according to the ratio of the total capacitance Cj_total of the gate electrode of the j-th row and the differential charge ΔQY(j), and this may be simply output via an interface/reading/detection circuit.

Since C(i,j) always has a positive value, negative weighting may not be implemented in the general cumulative multiplication and neural network operation implementation method expressed by ΔQY(j)=ΣC(i,j)*ΔVX(i). In order to realize negative weighting, a differential structure may be employed as in the embodiment of FIG. 11 to be described later. In this case, the same input voltage ΔVX(i) is applied to a pair of two differential input terminals 1130a and 1130b, and the charges Ca(i,j)*ΔVX(i) and Cb(i,j)*ΔVX(i) are generated in the corresponding differential common output terminals 1120a and 1120b by the cell capacitances Ca(i,j) and Cb(i,j) quantified by respective pieces of charge storage 1112a and 1112b. Therefore, when the amounts of charge generated by all input voltages are accumulated, they are converted into the differential amount of charge ΔQY(j)=Σ(Ca(i,j)−Cb(i,j))*ΔVX(i). When a pair of common output terminals are used as the +/− inputs of a differential amplifier, it is possible to obtain an output of a neural network operation proportional to the differential amount of charge (or a result of a transfer function such as a sigmoid function).

In another embodiment of the present invention, in the case of activating only one cell separately from artificial neural network operation, the weight of one cell may be read. However, in this case, differential output voltage ΔV will be small, and thus a more accurate voltage detection circuit may be required. In the case of simultaneously activating cells connected to one gate electrode in connection with artificial neural network operation, the input voltage VX(i) applied to each of the cells connected to one gate electrode may be considered the feature map (activation parameter) of each node of a previous layer. In this case, the MAC operation of the feature map of the previous layer and the weight value is automatically performed by a memory cell array structure capable of built-in MAC operation to obtain differential output voltage ΔVY(j).

In other words, in an embodiment of the present invention, in the construction of a cell array, the weight values stored in cells connected to one gate electrode may be directly generated and transferred as the feature values (activation parameters) of the nodes of a subsequent layer through in-memory operation without performing separate extraction and calculation processes. Accordingly, there is no need to provide a separate operation circuit.

There is assumed a case where the number of nodes in a previous layer is M and the number of nodes in a subsequent layer is N (In an embodiment, the numbers of nodes in the layers are the same, and M=N. For ease of description, there are assumed the embodiments of FIGS. 1, 2, 9 and 10 in which an input terminal is a well and a common output terminal is a gate). The weights for M×N matrix operation are composed of an N×M weight device array. Each of the N gate electrodes is connected to the M weight devices. The well biases of the M weight devices receive the feature values (activation parameters) of the M nodes of a previous layer as input. The N gate electrodes may generate the results of the MAC operations of the feature values of the M nodes of the previous layer and weights as differential output voltages, and the output values of the N gate electrodes may be transferred as the feature values (activation parameters) of the respective nodes of the subsequent layer. In this case, the interface circuit or detection circuit may obtain a result, combined with a transfer function into which the characteristics of the interface circuit or detection circuit are incorporated, as an output transfer signal Vout_Y(j) in the reading of the differential voltage of the gate electrode. In other words, the sum output signal ΔQY(j) or ΔVY(j) formed in the gate electrode is obtained as an output transfer signal Vout_Y(j) through the transfer function. The transfer function may be implemented by designing the characteristics of the interface circuit or detection circuit in such a manner as to incorporate a function, such as a sigmoid function, a ReLU function, or the like, thereinto.

Furthermore, the weight memory devices and the weight memory system according to an embodiment of the present invention do not require DC current because they are operated using a method of detecting differential voltage other than a current drive method during reading. Accordingly, power consumption may be reduced even when a large array is constructed and operated.

Figure 3:
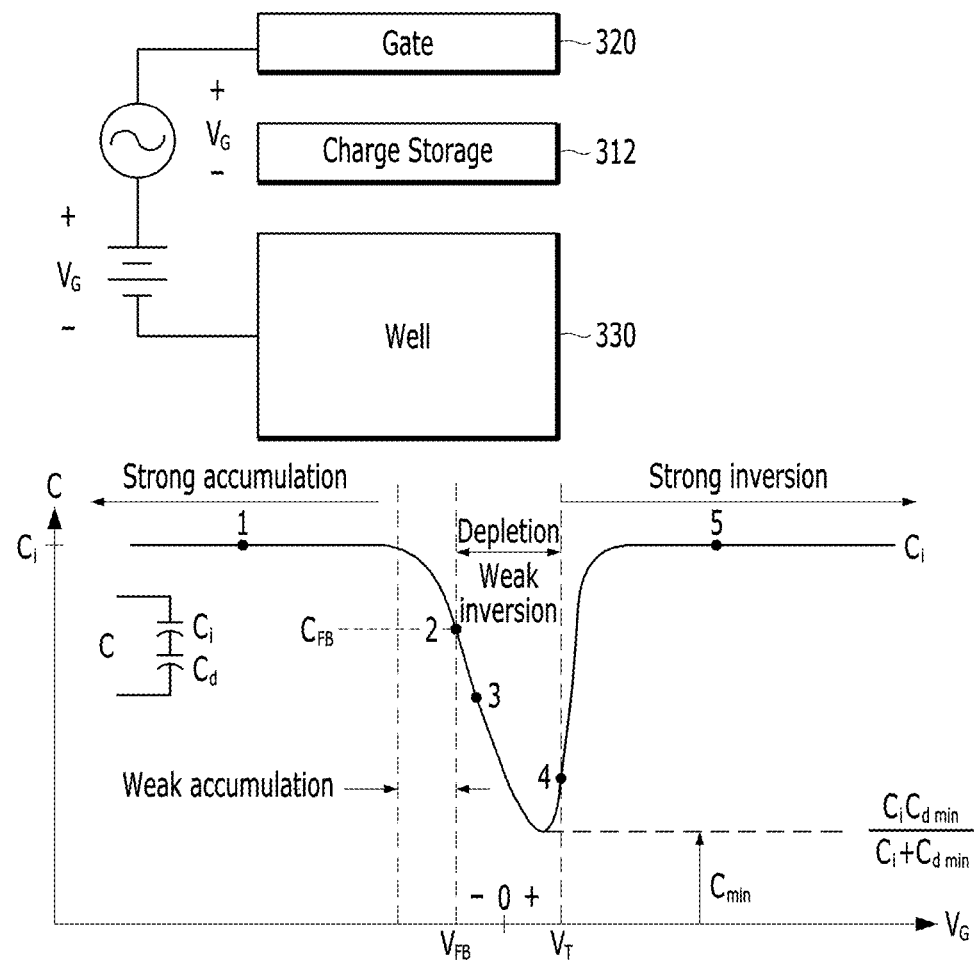
FIG. 3 is a diagram showing the C-V characteristic curve of a weight memory device according to an embodiment of the present invention.

FIG. 3 is a diagram showing the C-V characteristic curve of a weight memory device according to an embodiment of the present invention.

Referring to FIG. 3, voltage $V_G + v_G$ is applied between a common output terminal 320, i.e., a gate electrode, and an input terminal 330, i.e., a well. In this case, a large signal $V_G$ may be understood as the bias voltage of a read or write (programming) operation, and a small signal $v_G$ may be understood as the input signal of a read operation.

When charges are injected into charge storage 312 by a programming operation, a C-V curve may be shifted. For ease of description, it is assumed that the C-V characteristic curve shown in FIG. 3 shows a case where no charge is stored in the charge storage 312. In this case, when electrons having negative polarity are injected into the charge storage 312, the C-V characteristic curve may be shifted to the right from the curve in FIG. 3, and the threshold voltage $V_T$ and flat band voltage $V_{FB}$ may be changed to higher values. In contrast, when electrons are drawn out of the charge storage 312, the C-V curve may be shifted to the left from the curve in FIG. 3, and threshold voltage $V_T$ and flat band voltage $V_{FB}$ may be changed to lower values.

In the case where there is assumed a case where no charge is injected into the charge storage 312 and reference is made to the C-V characteristic curve of FIG. 3, when a read bias voltage is applied between the gate and the well and gate voltage is lower than well voltage, i.e., $V_G<0$ and $V_G<V_{FB}$, the weight memory device formed by the common output terminal 320, the charge storage 312, and the input terminal 330 is in a strong accumulation state. When the read bias voltage increases and $V_G$ approaches $V_{FB}$, the weight memory device enters a weak accumulation state. In a section in which $V_{FB}<V_G<V_T$ because the read bias voltage increases further, a depletion region is formed in a region adjacent to the charge storage 312 of the well, and the weight memory device enters a weak inversion state. As the read bias voltage increases further, an inversion region, i.e., a channel, is formed in a region adjacent to the charge storage 312 of the well in a region where $V_G>V_T$, and the weight memory device enters a strong inversion state.

In this case, referring to the C-V characteristic curve of FIG. 3, when the read bias voltage $V_G$ is 0 V, the weight memory device is in a weak inversion state. In this case, when the small signal $v_G$ is added to the read bias voltage and a resultant signal is applied as an input signal, the read bias voltage $V_G$ is applied as an operation point, and the capacitance value determined by the read bias voltage and the C-V characteristic curve serves as the weight data stored in the weight memory device.

In this case, the weight memory device in the weak inversion state has a capacitance value proportional to the change in the read bias voltage. When the read bias voltage changes from a large signal level but does not deviate from the weak inversion state, the capacitance value is quantified by the read bias voltage and the C-V characteristic curve.

Meanwhile, the C-V characteristic curve of the weight memory device may be shifted to the left or right by the amount of charge injected into or drawn out of the charge storage 312 by a programming operation. When the shift of the C-V characteristic curve of the weight memory device is determined by the programming operation, the capacitance value of the operating point at the time when a fixed read bias voltage is applied may be determined by the shifted C-V characteristic curve.

For example, when the read bias voltage is fixed at 0 V, the capacitance of each weight memory device may be quantified by a programming operation performed before the read operation, and the shift of the C-V characteristic curve and the change in the capacitance may be quantified in proportion to the weight data to be stored by the weight memory device. The process of quantifying the capacitance may be performed by a programming bias voltage during a programming operation, a time period during which the programming bias voltage is applied, and the number of repetitions of a high-voltage pulse signal through which the programming bias voltage is applied.

The C-V characteristic curve of FIG. 3 is a characteristic at the time when a small signal $v_G$ has a very low frequency. In the case of a large signal having a step pulse form like the input signal of the present invention, an inversion layer is not formed according to a change in the gate-well voltage ($V_{GB}$), and thus the signal has a different C-V characteristic. There is no inversion layer. Accordingly, as the bias increases, the width of the depletion layer continues to increase and thus there is provided a C-V characteristic in which the capacitance continues to decrease, which is shown in FIG. 4.

Figure 4:
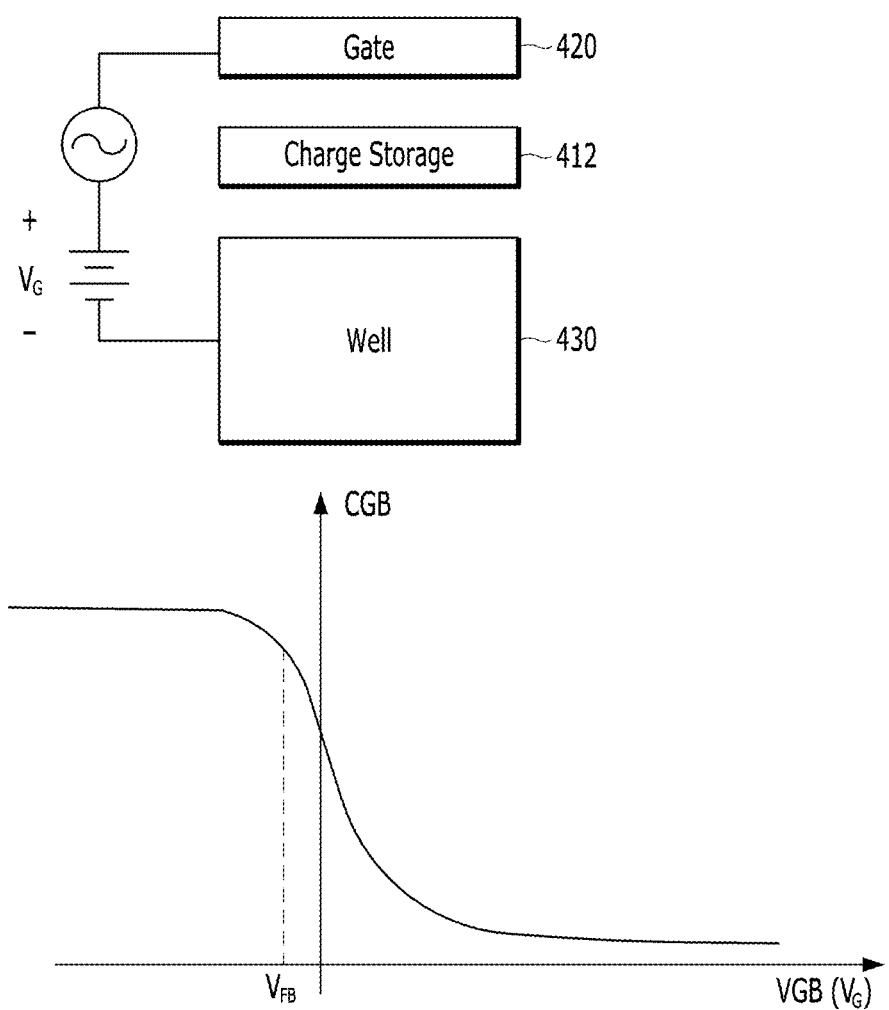
FIG. 4 is a diagram showing a C-V characteristic curve between a gate and a well in the case where a weight memory device according to an embodiment of the present invention has a source/drain (S/D) structure or a large signal pulse voltage is applied to the well.

FIG. 4 is a diagram showing the C-V characteristic curve of a weight memory device according to an embodiment of the present invention when a large signal is input.

When a pulse voltage $V_G$ corresponding to a read bias voltage is applied between an input terminal 430 and a common output terminal 420, a C-V curve shifted by the charge stored in charge storage 412 by a programming operation in advance is shown in FIG. 4.

When a read bias voltage fixed under the same condition is applied to a plurality of weight memory devices, the adjusted C-V characteristic of each of the weight memory devices is determined based on the fixed read bias voltage.

Figure 5:
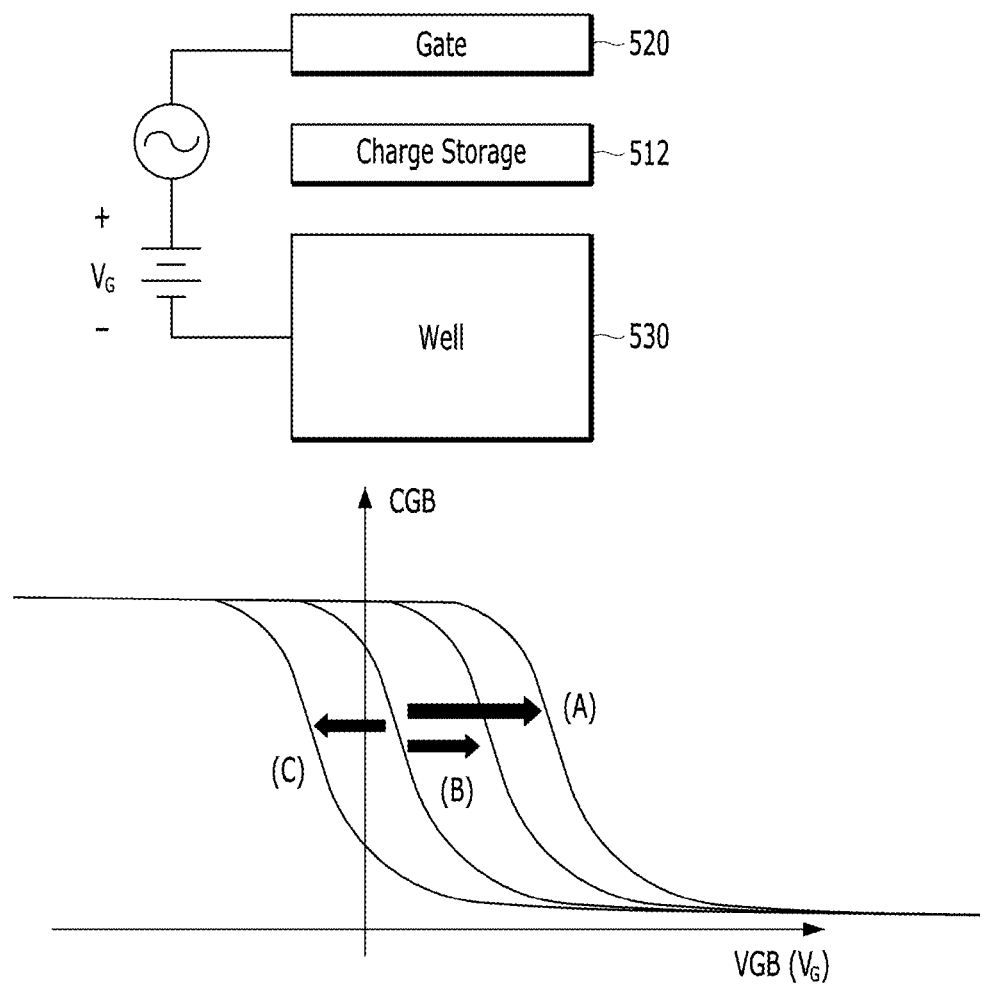
FIG. 5 is a diagram showing a write process of a weight memory device according to an embodiment of the present invention.

FIG. 5 is a diagram showing a write process of a weight memory device according to an embodiment of the present invention.

As charges are injected into or drawn out of the charge storage 512 depending on a programming bias condition, the capacitance between a common output terminal 520, i.e., a gate electrode, and an input terminal 530 connected to the well is changed. More specifically, the C-V characteristic curve of FIG. 5 is shifted to the left or right based on the polarity and amount of charge stored in the charge storage 512. In this case, the C-V characteristic curve is a curve along which the capacitance formed between the common output terminal 520 and the input terminal 530 is shown based on $V_G$ corresponding to a read bias voltage when it is assumed that $V_G$ corresponding to the read bias voltage is applied between the common output terminal 520 and the input terminal 530.

When electrons having negative polarity are injected into the charge storage 512, the C-V characteristic curve is shifted to the right (see curves (A) and (B)). In contrast, when the electrons are drawn out of the charge storage 512, the C-V characteristic curve is shifted to the left (see curve (C)). When the quantity of electrons injected into the charge storage 512 is larger, the width by which the C-V characteristic curve is shifted is larger (see curve (A)). In contrast, when the quantity of electrons is smaller, the width by which the C-V characteristic curve is shifted is smaller. (see curve (B)).

A programming operation of injecting electrons into or drawing electrons out of the charge storage 512 is typically performed when $V_{GB}$ is a significantly high voltage. In contrast, $V_{GB}$ corresponding to a read bias voltage is lower than a programming bias voltage, and the read bias voltage is set on the assumption that there is no change in the charge stored in the charge storage 512 under the condition that the read bias voltage is applied.

Although not shown in FIG. 5, a drain region and/or a source region may be disposed in some regions near the charge storage 512 of the well region of FIG. 5 to assist in a programming operation. Referring to FIGS. 3 and 5 together, a programming operation may frequently use the strong inversion state or strong accumulation state of FIG. 3. In this case, in the strong accumulation state, a number of holes attracting electrons stored in the charge storage 512 may be supplied from the well region and accumulated near the charge storage 512. Meanwhile, in the strong inversion state, electrons to be injected into the charge storage 512 may be accumulated in an inversion region, i.e., a channel region. Once the drain and/or source regions are formed, more electrons are smoothly supplied to the channel region, so that the quantity of electrons to be injected into the charge storage 512 may be accurately predicted based on programming bias conditions (the voltage, duration and number of pulses of a programming bias, etc.) and a change in the charge stored in the electric charge storage 512 attributable to a programming operation may be accurately implemented.

Figure 6:
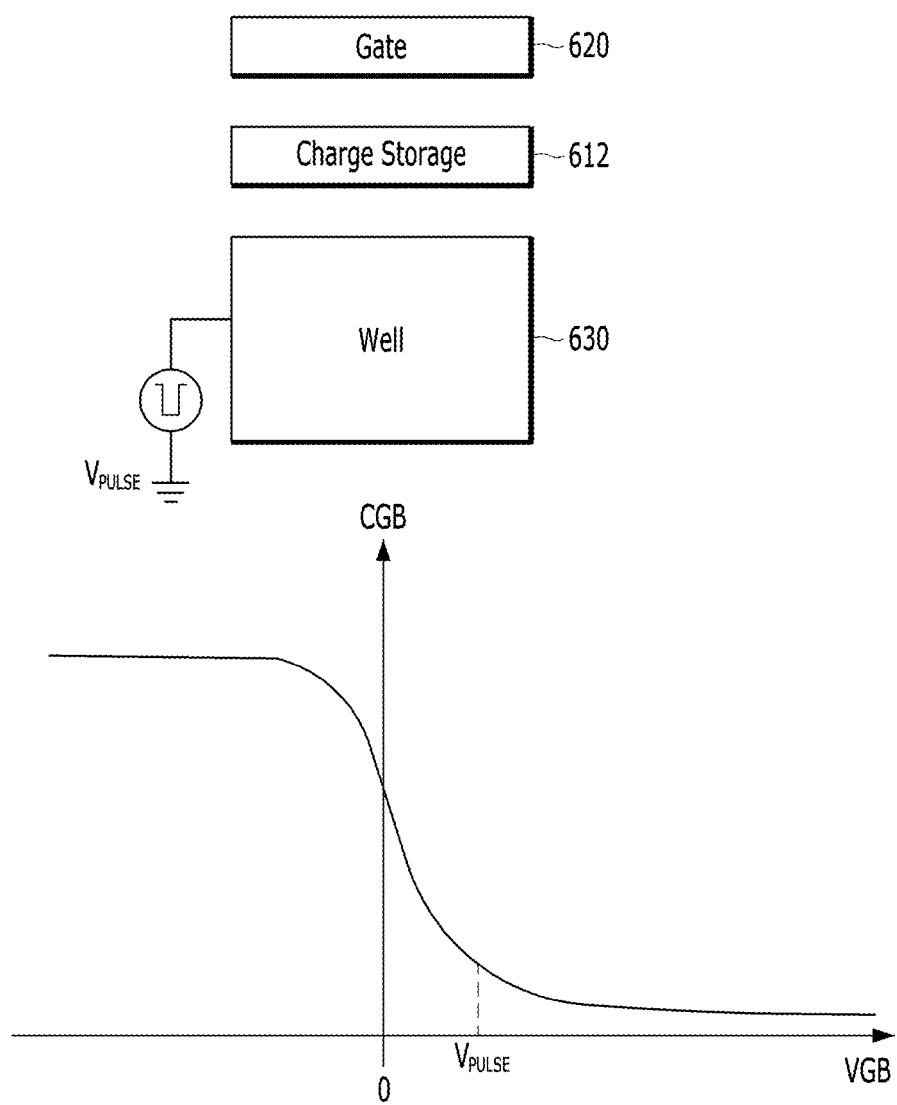
FIGS. 6 and 7 are diagrams showing a read process of a weight memory device according to an embodiment of the present invention.

FIG. 6 is a process showing a read process of a weight memory device according to an embodiment of the present invention.

In FIG. 6, there is assumed a case where read bias voltage is 0 V. In other words, there is shown a case where the same voltage is applied to a common output terminal 620, i.e., a gate electrode, and an input terminal 630 connected to a well and thus the voltage between the common output terminal 620 and the input terminal 630 is 0 V.

A $V_{PULSE}$ signal having a negative polarity is applied to the input terminal 630. The voltage between the common output terminal 620 and the input terminal 630 is maintained at $V_{PULSE}$ V for the duration of a pulse signal by the $V_{PULSE}$ signal. In this case, the area surrounded by the $V_{GB}$ axis and the C-V characteristic curve may be obtained by the integration of the C-V characteristic curve, and the amount of charge coupled to a gate electrode connected from the well connected to the input terminal 630 to the common output terminal 620 may be modeled using the integral of the C-V characteristic curve in the $V_{GB}=[0, V_{PULSE}]$ section.

When electrons are injected into the charge storage 612 by a programming operation prior to a read operation, the C-V characteristic curve of the corresponding weight memory device will shift to the right from the characteristic curve shown in FIG. 6. Accordingly, when the $V_{PULSE}$ signal is applied to the weight memory device, the amount of charge coupled to the gate electrode connected to the common output terminal 620 is larger than that in the embodiment shown in FIG. 6. In contrast, when electrons are drawn out of the charge storage 612 by a programming operation prior to a read operation, the C-V characteristic curve of the corresponding weight memory device will shift to the left from the characteristic curve shown in FIG. 6. Accordingly, when the $V_{PULSE}$ signal is applied to the weight memory device, the amount of charge coupled to the gate electrode connected to the common output terminal 620 is smaller than that in the embodiment shown in FIG. 6.

Figure 7:
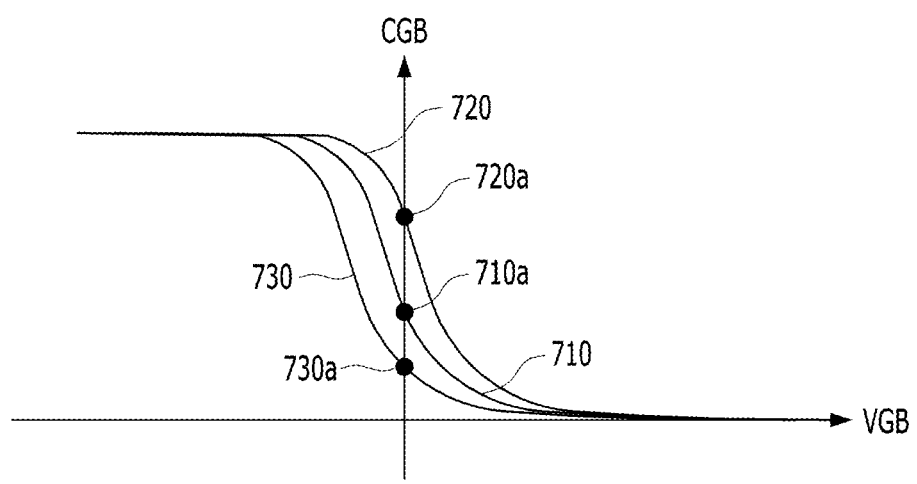

FIG. 7 is a diagram showing a read process of a weight memory device according to an embodiment of the present invention.

Referring to FIG. 7, there is shown a case where a read bias voltage is 0 V. In this case, when a small signal model in which it is assumed that the $V_{PULSE}$ value introduced in FIG. 6 is very small in FIG. 7 is applied, modeling may be performed such that the capacitance of the weight memory device is determined based on a C(V) value at an operating point by a read bias voltage.

The first capacitance 710a of the first memory device in the case where $V_{GB}$=0 V may be obtained based on the first C-V characteristic curve 710 of the first memory device that has not been programmed.

During a programming operation, the second capacitance 720a of a second memory device in the case where $V_{GB}$=0 V may be obtained based on the second CV characteristic curve 720 of the second memory device in which charges have been accumulated in charge storage and a weight has been increased. Since the second capacitance 720a is higher than the first capacitance 710a, it can be seen that the weight data stored in the second memory device is larger than the weight data stored in the first memory device.

During a programming operation, the third capacitance 730a of a third memory device in the case of $V_{GB}$=0 V may be obtained based on the third CV characteristic curve 730 of the third memory device in which charges have been drawn out of charge storage and thus a weight has been decreased. Since the third capacitance 730a is lower than the first capacitance 710a, it can be seen that the weight data stored in the third memory device is smaller than the weight data stored in the first memory device.

Figure 8:
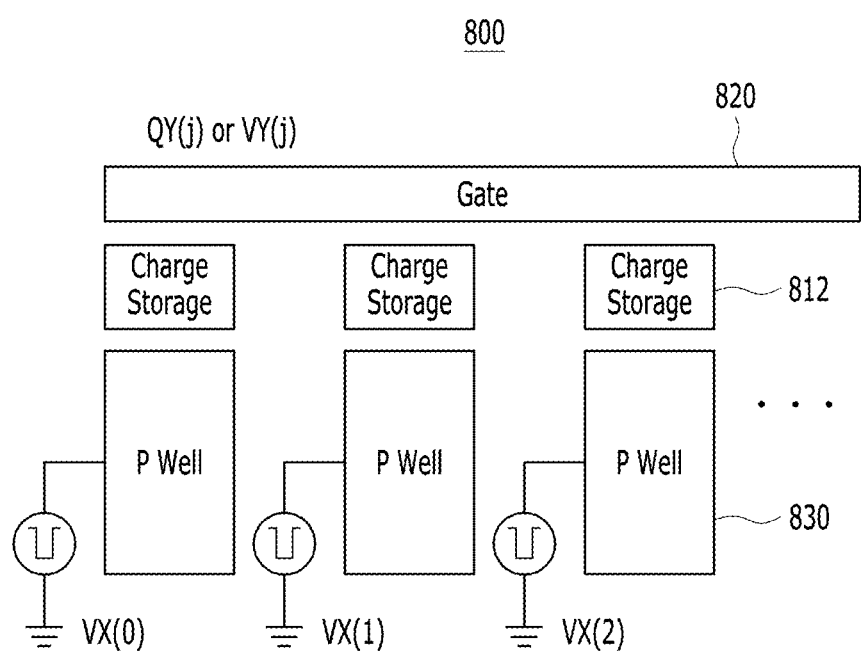
FIG. 8 is a diagram showing weight memory devices and a weight memory system according to an embodiment of the present invention.

FIG. 8 is a diagram showing weight memory devices and a weight memory system according to an embodiment of the present invention.

Referring to FIG. 8, a weight memory system 800 includes a plurality of weight memory devices connected to one common output terminal 820. Each of the weight memory devices includes a common output terminal 820, charge storage 812, and an input terminal 830. In FIG. 8, part of an array of the weight memory devices connected to the one common output terminal 820 is shown.

When an input signal VX(i) is input to the individual input terminal 830, a charge amount change component induced to the common output terminal 820 based on the input signal VX(i) is determined by the integral value of the electrostatic capacitance C(i,j) dV of an (i,j)-th weight memory device, as shown in FIG. 6. In this case, if VX(i) is a small signal, the integral expression can be approximated by a linear relation using the average value of capacitances C(i,j) in the case where the constant VX(i) is applied.

The amount of charge QY(j) of the sum output signal Y(j) induced to the common output terminal 820 corresponding to the j-th row may be expressed by Equation 1 below;

$$\Delta QY(j) = \sum_{i=1}^{M} \int_{0}^{VX(i)} C(i,j) dV \approx \sum_{i=1}^{M} \overline{C(i,j)} VX(i) \quad (1)$$

where j is a row index and a natural number having a value within a range of 0 to N−1, and i is a column index and a natural number having a value within a range of 0 to M−1.

Figure 9:
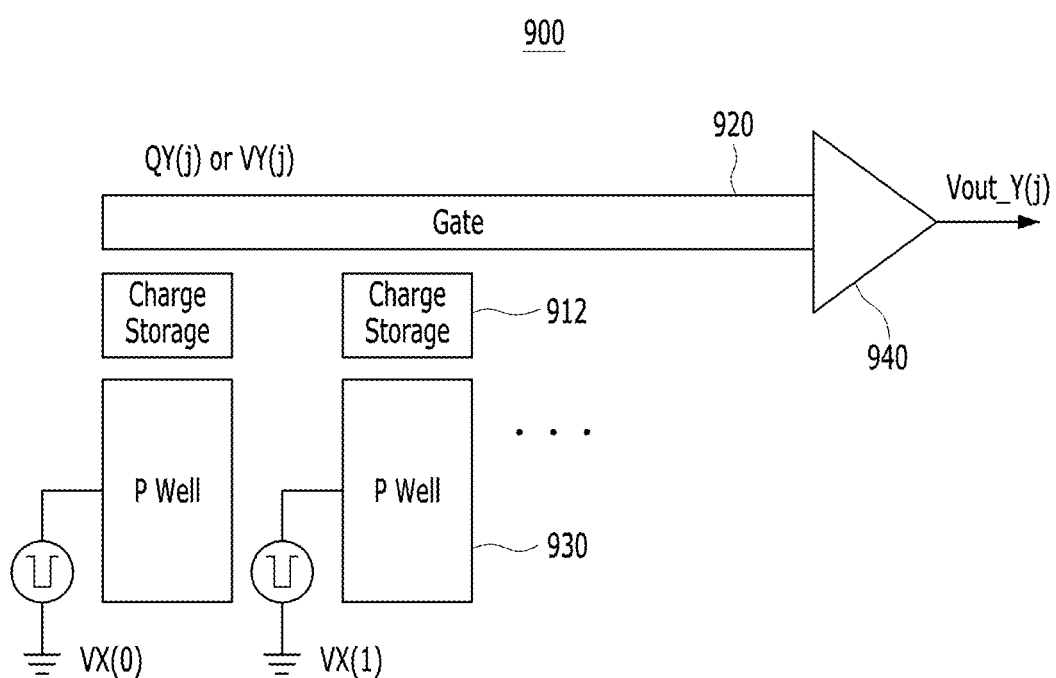
FIG. 9 is a diagram showing weight memory devices, an interface circuit, and a weight memory system according to an embodiment of the present invention.

FIG. 9 is a diagram showing weight memory devices, an interface circuit, and a weight memory system according to an embodiment of the present invention.

Referring to FIG. 9, a weight memory system 900 includes a plurality of weight memory devices connected to one common output terminal 920. Each of the weight memory devices includes the common output terminal 920, charge storage 912, and an input terminal 930. In FIG. 9, there are shown part of an array of the plurality of weight memory devices connected to the one common output terminal 920, and an interface circuit 940.

In FIG. 9, the signal perception/detection function of the interface circuit 940 is described.

The sum output signal of the common output terminal 920 represented by Equation 1 is converted into an output transfer signal Vout_Y(j) while passing through the interface circuit 940. In this case, the output transfer signal Vout_Y(j) is represented by Equation 2 below:

$$\text{Vout\_Y}(j) = Func\left[\sum_{i=1}^{M} \overline{C(i,j)} VX(i)\right] \quad (2)$$

where Func[ ] is an output transfer function and may be implemented by the interface circuit 940. The output transfer function may be a well-known sigmoid or ReLU function or another modified transfer function depending on the embodiment.

In this case, the output transfer signal converted by the output transfer function may be designed to have the same physical dimension as the input signal X(i). For example, the input signal X(i) may be applied to the input terminal 930 as a voltage signal VX(i). In particular, the input voltage signal VX(i) may be applied as an increase or increment in voltage over time. In this case, in the weight memory system 900 according to an embodiment of the present invention, the output transfer signal is generated as a voltage signal, and thus a conversion circuit for converting the dimension between the input signal and the output signal, i.e., converting current to voltage or vice versa may not be required.

When the input signal and the output signal are of the same dimension, particularly voltage, the result of a weight MAC operation with a previous layer may be transmitted to a weight MAC operation with a subsequent layer without additional circuitry or with minimal additional circuitry. A chain of weight MAC operations may be formed without limitations to a connection process, and the inference operation of an artificial neural network may be rapidly performed. Although there may be cases where the output of a previous layer may be transferred as an analog function without change in an artificial neural network, it is implemented as a sigmoid function in many artificial neural networks. In this case, in an embodiment of the present invention, a circuit having a sigmoid transfer function may be adopted as the detection circuit/interface circuit 940.

Meanwhile, depending on an artificial neural network, it may be modified to apply a function other than sigmoid. In the present embodiment, the transfer characteristic function (output transfer function) of the detection circuit/interface circuit 940 may be set based on the transfer function required by the artificial neural network, and it is possible to appropriately cope with various variations of the artificial neural network.

In recent artificial neural network research, various functions such as a ReLU function are used to determine the output value of each layer, so that such a function may be implemented such that the gain of an op amp is adjusted to a low value to generate an output signal proportional to the sum ΔV when it falls within a predetermined threshold range. In other words, the characteristic curve of a circuit, such as an op amp circuit, constituting the detection circuit/interface circuit 940 may be adjusted to fit the transfer function (a function such as a sigmoid function, a ReLU function, or the like) pursued in the artificial neural network.

Figure 10:
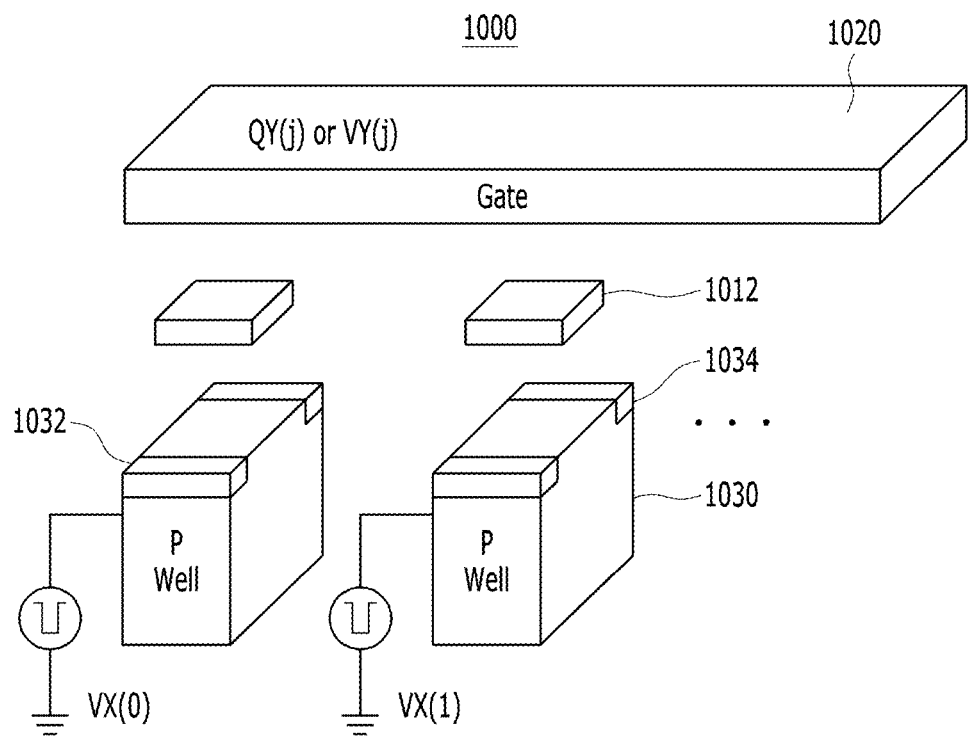
FIG. 10 is a diagram showing weight memory devices and a weight memory system according to an embodiment of the present invention.

FIG. 10 is a diagram showing weight memory devices and a weight memory system according to an embodiment of the present invention.

Referring to FIG. 10, a weight memory system 1000 includes a plurality of weight memory devices connected to one common output terminal 1020. Each of the weight memory devices includes the common output terminal 1020, charge storage 1012, and an input terminal 1030. In FIG. 10, there is shown part of an array of the plurality of weight memory devices connected to the one common output terminal 1020.

Each of the weight memory devices may include the regions of a drain 1032 and a source 1034 that are disposed in some regions on a well forming the input terminal 1030 and provide an auxiliary bias condition between the input terminal 1030 and the common output terminal 1020.

The regions of the drain 1032 and the source 1034 are formed to come into contact with a region (channel region) facing the charge storage 1012 and the gate on the well forming the input terminal 1030 and to provide charges to the channel region by the gate voltage. Referring to the foregoing descriptions of FIGS. 3 and 5 additionally, a programming operation for each of the weight memory devices may use the strong inversion or strong accumulation state of FIG. 3, and for this purpose, may utilize the biases of the drain 1032 and the source 1034.

Although only one weight memory cell is shown on one well, i.e., the one input terminal 1030, in FIG. 10 for ease of description, a plurality of weight memory cells will be arranged repeatedly along the same well in a column direction (a second direction) orthogonal to the gate. Accordingly, the well, i.e., the input terminal 1030, may have a long conductor shape in the second direction orthogonal to the gate, which is a direction not shown in FIG. 10, and the well may be shared between weight memory cells corresponding to the same column. The regions of the drain 1032 and the source 1034 may be shared with an adjacent weight memory cell, which has the same cell structure as NAND Flash memory.

Referring to the embodiment of FIG. 10, the well forming the input terminal 1030 is a P-type well, in which during programming using a strong accumulation state, a number of holes are supplied from the well region and accumulated near the interface of the channel region, so that the well may smoothly support a process in which electrons stored in the charge storage 1012 are drawn out of the charge storage 1012. In this case, the P-type well may provide support to accurately predict a process in which electrons are drawn out of the charge storage 1012 when a specific programming bias condition is applied between the common output terminal 1020 and the input terminal 1030.

During a programming operation using a strong inversion state, electrons to be injected into the charge storage 1012 may be accumulated in the channel region formed in a region near the charge storage 1012. In this case, the electrons are minority carriers in the P-type well, and thus the density of electrons accumulated in the channel region may not meet the density of electrons required for a programming operation. In this case, the N-type doped drain 1032 and source 1034 may be connected to the channel region and supply electrons to the channel region. The electrons supplied to the channel region may be injected into the charge storage 1012 during a programming operation, and may support the smooth performance of the programming operation.

When the drain region 1032 and/or the source region 1034 are formed and furthermore appropriate auxiliary bias conditions are applied to the drain region 1032 and/or the source region 1034, more electrons are smoothly supplied to the channel region. Accordingly, the quantity of electrons to be injected into the charge storage 1012 may be accurately predicted based on programming bias conditions (the voltage, duration, and number of pulses of a programming bias), and an actual change in the charge stored in the charge storage 1012 attributable to a programming operation may be accurately implemented.

When appropriate auxiliary bias conditions are applied to the drain region 1032 and/or the source region 1034, the capacitance $C_{gb}$ of each weight memory device corresponding to the synapse weight factor of an artificial neural network may be converged into zero in the state in which the gate voltage is a threshold voltage or higher. Accordingly, an inversion layer may be formed from the source/drain in a programming operation or an erase operation, and there is formed a semiconductor device structure close to a MOSFET structure the operating principle of which is well known. As a result, various read/write operations based on a MOSFET structure may be performed, and thus the coupling of additional circuits for the individual testing of the weight memory device is facilitated. In addition, during a programming or erase operation based on the MOSFET structure, a change in the C-V characteristics may be accurately controlled by the auxiliary bias conditions of the source/the drain, and a change in the electric charge stored in the charge storage 1012 attributable to a programming operation may be accurately implemented.

The auxiliary bias conditions applied to the source 1034 and the drain 1032 may be set to optimize the circuit operations, such as programming, reading, and testing, of the weight memory cell. For the efficient control of the operation of an overall cell array circuit, the source 1034 and drain 1032 of each cell may be freely connected through wiring in the first direction (the gate direction), the second direction, or any other topology at a designer's discretion. For example, the drains 1032 of adjacent weight memory devices included in one row may be connected to one electrode in common, and the common electrode of the drains 1032 may be connected in the same first direction as the common output terminal 1020. Similarly, the sources 1034 of adjacent weight memory devices included in one row may be connected to one electrode in common, and the common electrode of the sources 1034 may be connected in the same first direction as the common output terminal 1020. The channel region connected between the drain 1032 and the source 1034 in each of the weight memory devices may have a form orthogonal to the gate electrode connected to the common output terminal 1020. In another embodiment of the present invention, the drains 1032 and sources 1034 of weight memory devices may be connected through wiring in the second direction orthogonal to a gate electrode or any other topology.

Figure 11:
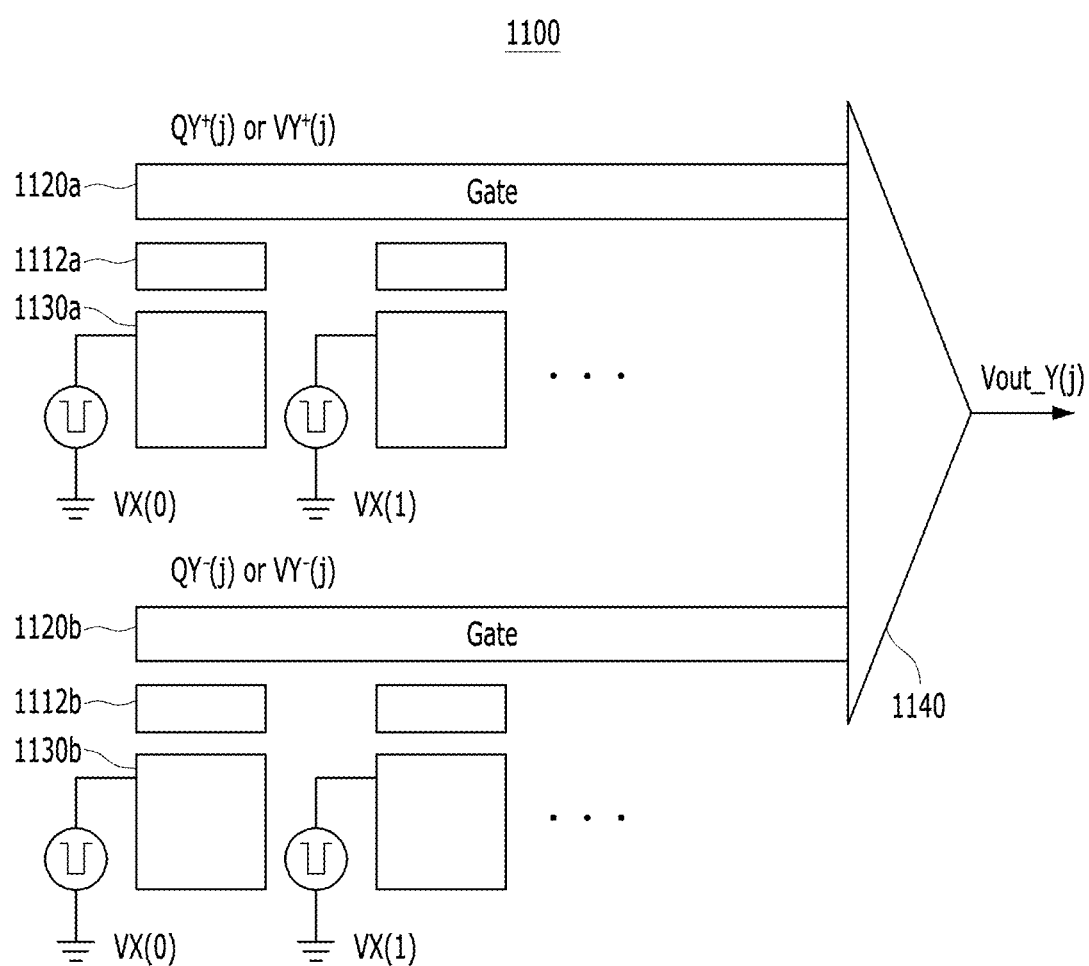
FIG. 11 is a diagram showing weight memory devices, an interface circuit, and a weight memory system according to an embodiment of the present invention.

FIG. 11 is a diagram showing a weight memory device, an interface circuit, and a weight memory system according to an embodiment of the present invention.

Referring to FIG. 11, a weight memory system 1100 includes a plurality of weight memory devices connected to a pair of common output terminals 1120a and 1120b. Each of the weight memory devices includes the pair of common output terminals 1120a and 1120b, a pair of charge storages 1112a and 1112b, and a pair of input terminals 1130a and 1130b. The pair of input terminals 1130a and 1130b are connected to the same electrode, and the same input voltage is applied. In FIG. 11, there is shown part of an array of the plurality of weight memory devices connected to the pair of common output terminals 1120a and 1120b and a detection circuit/interface circuit 1140.

The positive weight memory devices connected to the positive common output terminal 1120a receive input signals VX(i) and transfer positive charge amount change components to the positive common output terminal 1120a, and a sum positive output signal $QY^+(j)$ or $VY^+(j)$ is formed at the positive common output terminal 1120a.

In the same manner, the negative weight memory devices connected to the negative common output terminal 1120b receive input signals VX(i) and transfer negative charge amount change components to the negative common output terminal 1120b, and a sum negative output signal $QY^-(j)$ or $VY^-(j)$ is formed at the negative common output terminal 1120b.

The detection circuit/interface circuit 1140 may generate an output transfer signal Vout_Y by a differential operation between the sum positive output signal $QY^+(j)$ or $VY^+(j)$ and the sum negative output signal $QY^-(j)$ or $VY^-(j)$.

The weight memory system 1100 according to an embodiment of the present invention may deal with a case where a weight factor between artificial neural network layers is negative via a differential operation. The weight memory system 1100 according to an embodiment of the present invention may also deal with more variously designed artificial neural network structures by combining the above-described various output transfer functions, e.g., a sigmoid function, a ReLU function, etc.

The weight memory system 1100 according to an embodiment of the present invention generates an output transfer signal Vout_Y(j) based on changes in the amount of charge or voltage induced to the pair of common output terminals 1120a and 1120b, thereby enabling a differential operation circuit to be formed more easily than the conventional neuromorphic system that generates a current output signal.

As described above, in the general cumulative multiplication operation implementation, it is impossible to implement a case where a weight has a negative value. In contrast, in the embodiment of FIG. 11, when the pair of common output terminals 1120a and 1120b are used as +/− inputs of a differential amplifier, respectively, the output of a neural network operation proportional to the differential amount of charge (or a result of a transfer function such as a sigmoid function) may be obtained.

Figure 12:
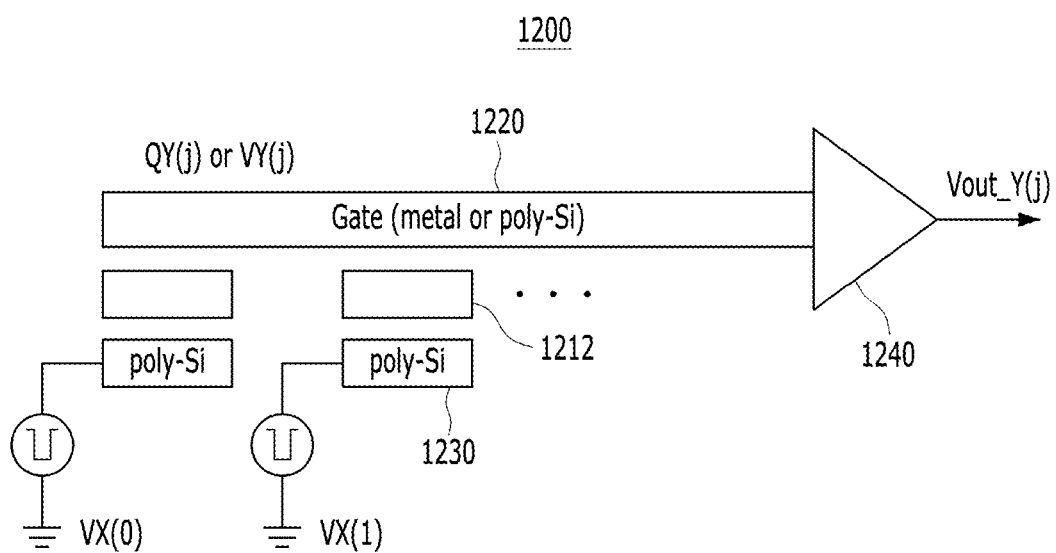
FIG. 12 is a diagram showing weight memory devices, an interface circuit, and a weight memory system according to an embodiment of the present invention.

FIG. 12 is a diagram showing weight memory devices, an interface circuit, and a weight memory system according to an embodiment of the present invention.

Referring to FIG. 12, a weight memory system 1200 includes a plurality of weight memory devices connected to one common output terminal 1220. Each of the weight memory devices includes a common output terminal 1220, charge storage 1212, and an input terminal 1230. In FIG. 12, there are shown part of an array of the weight memory devices connected to the one common output terminal 1220, and an interface circuit 1240.

In the embodiment of FIG. 12, a gate electrode is disposed as the common output terminal 1220, and a deposited semiconductor wire on another layer intersecting the gate may be used as the input terminal 1230. In this case, various semiconductor materials including polysilicon may be applied as the deposited semiconductor wire. The wires forming the input terminal 1230 and the gate terminal 1220 may be made of the same material, or may be made of different materials if necessary. For example, the wire of the input terminal 1230 may be implemented as polysilicon, and a metal wire may be used as the gate, i.e., the common output terminal. However, when both the input terminal and the gate terminal use metal, capacitance becomes a fixed value, and therefore this case cannot be applied to the present invention.

When the embodiment of FIG. 12 is compared with the preceding embodiments of FIGS. 9 and 10, the embodiment of FIG. 12 is an embodiment in which a deposited semiconductor (or metal) wire is substituted for the well of the substrate which is the input terminal in the embodiments of FIGS. 9 and 10, and even the deposited semiconductor wire may be provided with a drain/source as in the embodiment of FIG. 10.

As described above, in the embodiment of FIG. 12, the separation (or electrical isolation) of the input terminal 1230 is easy, and thus the degree of integration may be significantly improved. Even in the embodiment of FIG. 12, as in the well of the substrate, the source/drain may be formed in the deposited semiconductor that is used as the input terminal 1230 or common output terminal 1220. Various semiconductor materials such as oxide semiconductor materials, and/or polysilicon may be used for the deposited semiconductor. In this case, one of the input terminal 1230 and the common output terminal 1220 may be made of a metal wire instead of a deposited semiconductor.

Figure 13:
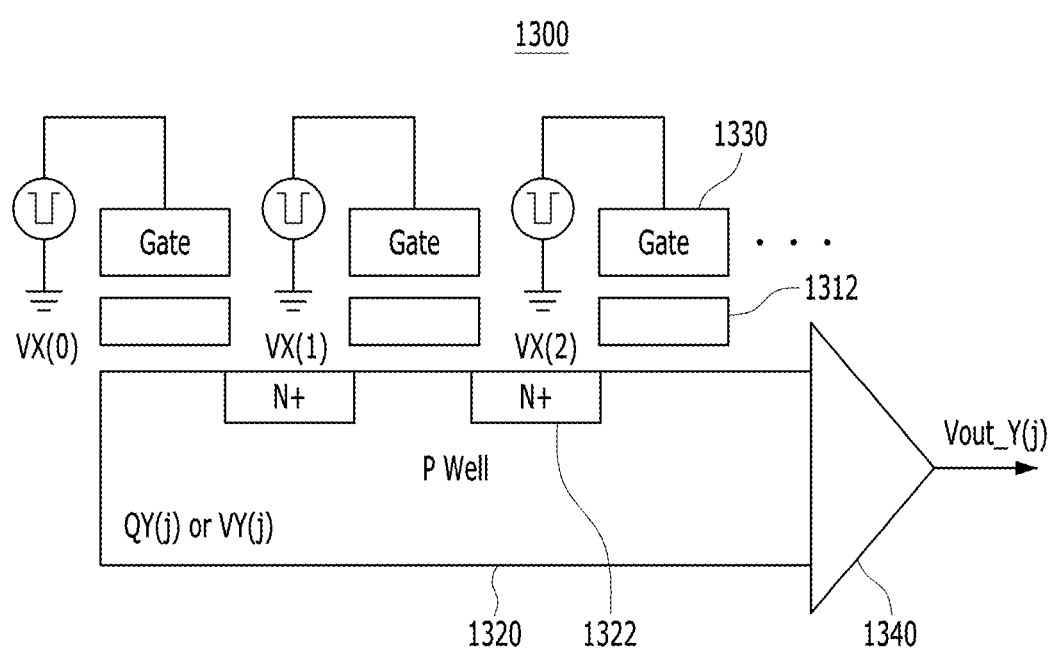
FIG. 13 is a diagram showing weight memory devices, an interface circuit, and a weight memory system according to an embodiment of the present invention.

FIG. 13 is a diagram showing weight memory devices, an interface circuit, and a weight memory system according to an embodiment of the present invention.

Referring to FIG. 13, a weight memory system 1300 includes a plurality of weight memory devices connected to one common output terminal 1320. Each of the weight memory devices includes the common output terminal 1320, charge storage 1312, and an input terminal 1330. In FIG. 13, there are shown part of an array of the weight memory devices connected to the one common output terminal 1320, and an interface circuit 1340.

In the embodiment of FIG. 13, a P-type well may be disposed as the common output terminal 1320, and the gate electrode of each of the weight memory devices may be disposed as the input terminal 1330. In this case, when the common output terminal 1320 is disconnected from a driving circuit that applies a bias, a read operation is performed in the state in which the common output terminal 1320 does not have an intended charge leakage path except that it is electrically connected to the input of the interface circuit 1340.

If necessary, a source/drain may be provided on the P-type well on which the common output terminal 1320 is formed. In FIG. 13, there is shown an embodiment in which a drain/source is provided on the P-type well forming the common output terminal 1320 and is shared by adjacent weight memory devices. In other words, the shared drain/source 1322 may be doped with N+, and may be disposed between charge storages 1312 between adjacent memory devices (memory cells). The shared drain/source 1322 is disposed between the adjacent memory devices, and thus the area occupied by an array of memory devices corresponding to one row may be reduced.

When the embodiment of FIG. 13 is compared with the preceding embodiments of FIGS. 9 and 10, the embodiment of FIG. 12 is an embodiment in which the input and output of the semiconductor device are interchanged in the embodiments of FIGS. 9 and 10.

The embodiment of FIG. 13 is an embodiment in which the structure of conventional NAND flash memory is modified. In this embodiment, the degree of integration of memory cells may be increased, and the sequential operations of cells may be required during operation. However, in the present embodiment, even when input signals VX(i) are applied not simultaneously but sequentially, charge amount change components are accumulated in the common output terminal 1320 without loss of information, and thus the result of an error-free MAC operation may be generated as an output transfer signal Vout_Y(j).

Although the weight memory device having a MOS structure implemented using the P-type well and the gate electrode is shown in the embodiments of FIGS. 8 to 13, it will be apparent to those skilled in the art that the spirit of the present invention may also be modified and applied to a weight memory device having a MOS structure implemented using an N-type well and a gate electrode.

In the embodiments of FIGS. 8 to 13 and the embodiment modified to be implemented using an N-type well and a gate electrode, input signals VX(i) may be sequentially applied without a need to be simultaneously applied to one row. This is enabled because the input signals VX(i) use voltage/amount-of-charge based output signals rather than current outputs, unlike in the conventional neuromorphic system.

In the embodiments of FIGS. 8 to 13 and the embodiment modified to be implemented using an N-type well and a gate electrode, the voltage/amount-of-charge based output signals are generated, so that DC current does not occur, and the prior art Unlike neuromorphic systems, cells connected to one row or column are not required to operate simultaneously. Accordingly, in the present embodiment, timing control is relatively easily performed.

In an embodiment of the present invention, part of the conventional memory semiconductor process is utilized, so that the optimization and stabilization of the manufacturing process of the weight memory device is facilitated and the degree of integration of the weight memory cell structure may be considerably increased. In addition, in the present embodiment, the area occupied by a circuit for reading data stored in the weight memory device in response to an artificial neural network operation is reduced and the configuration of the data reading circuit is simplified, so that the overall degree of integration of the system including the array may be increased.

In the present embodiment, the reset of a stored weight value may be easily achieved by applying a bias opposite to that during storage for a predetermined time between the gate electrode and the well, and thus write, read, and erase (reset) processes may be all easily implemented. Accordingly, an advantage arises in that the present may easily deal with the configurations of various artificial neural networks such as a convolutional neural network (CNN) and a recurrent neural network (RNN).

Figure 14:
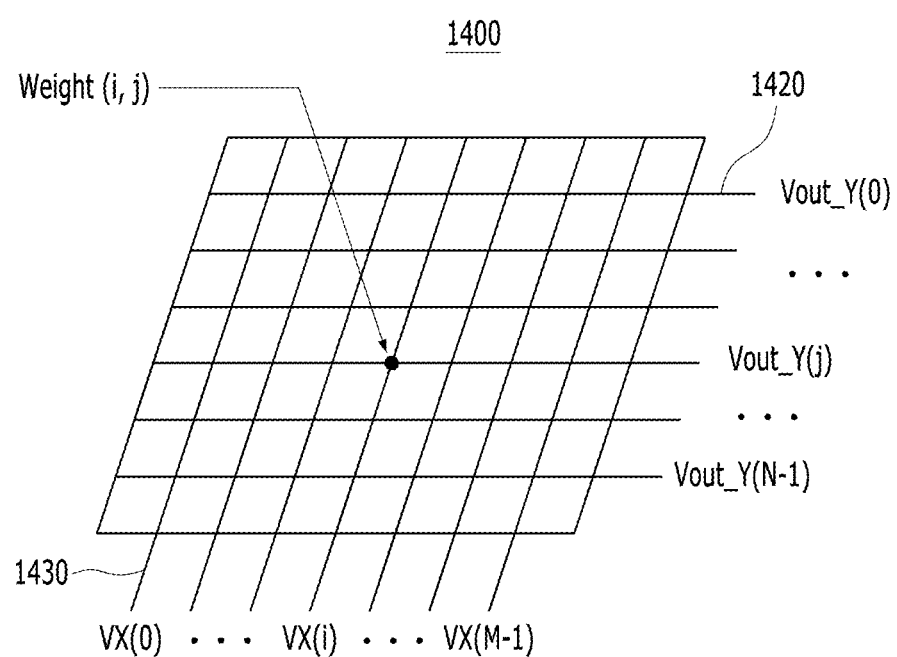
FIGS. 14 to 16 are diagrams showing an array of weight memory devices and a weight memory system according to an embodiment of the present invention.

FIG. 14 is a diagram showing an array of weight memory devices and a weight memory system according to an embodiment of the present invention.

Referring to FIG. 14, there are shown a first electrode 1420 extending in a first direction and corresponding to a row, and a second electrode 1430 extending in a second direction and corresponding to a column. Furthermore, as in the embodiments of FIGS. 8 to 11, the first electrode 1420 may be connected to the gate of each memory device and the second electrode 1430 may be connected to the well of each memory device. The embodiment of FIG. 12 is applied to the embodiment of FIG. 14, such that the second electrode 1430 may be connected to a deposited semiconductor or a metal wire. Alternatively, the embodiment of FIG. 13 may be applied, such that the first electrode 1420 may be connected to the well of each memory device and the second electrode 1430 may be connected to the gate electrode of each memory device.

Although the number of columns is shown as M and the number of rows is shown as N in general, the numbers of nodes in adjacent layers are the same in many embodiments of artificial neural networks. In an embodiment, M may be given as being equal to N, as shown in FIGS. 15 and 16 to be described later.

Figure 15:
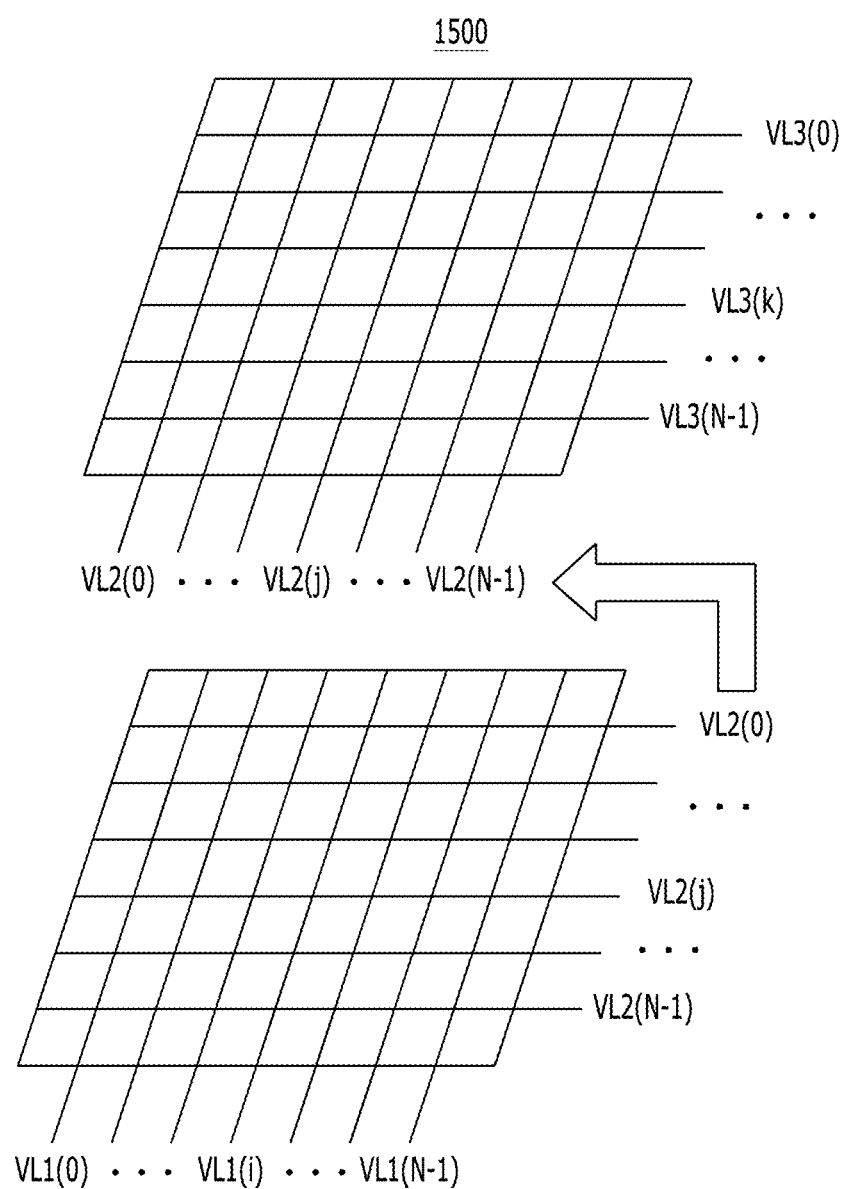
Figure 16:
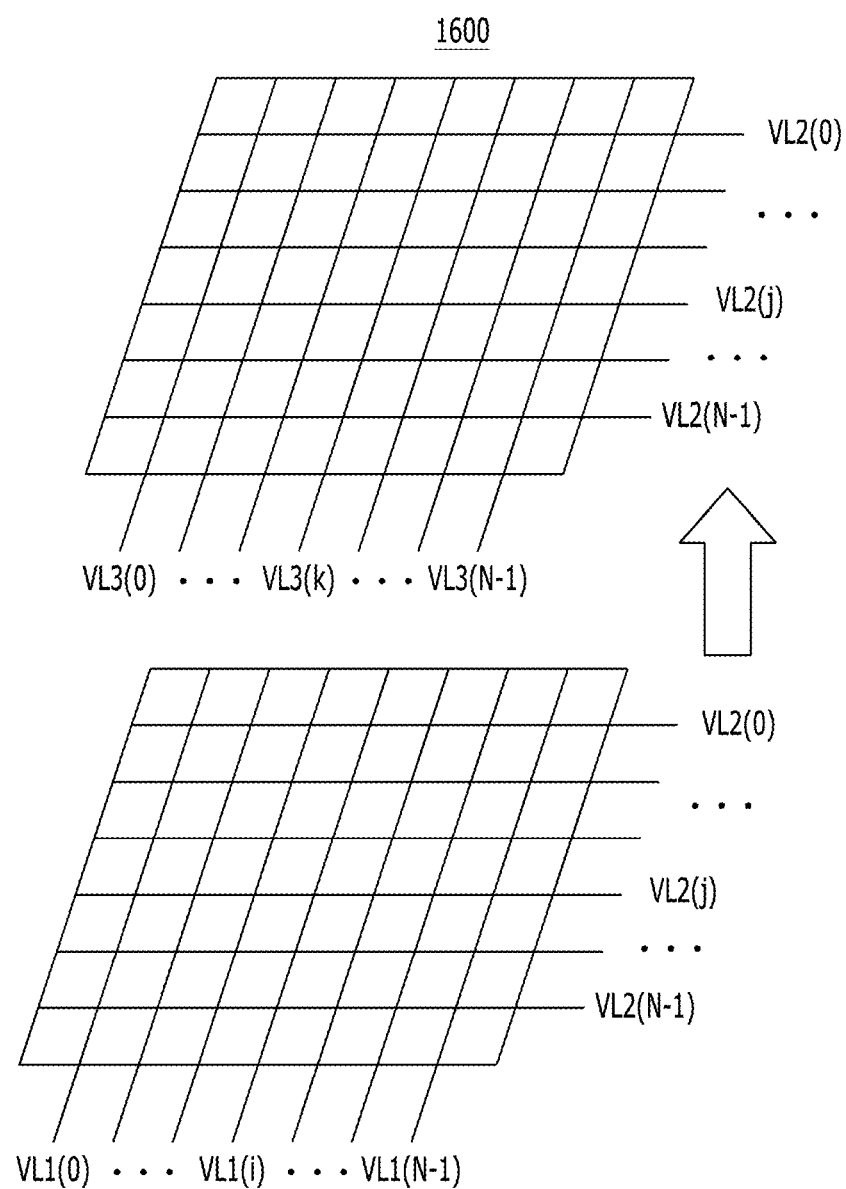

FIG. 15 is a diagram showing an array of weight memory devices and a weight memory system according to an embodiment of the present invention.

Referring to FIG. 15, a weight memory system 1500 includes a plurality of arrays corresponding to weight operations between the plurality of layers of an artificial neural network. Each array assumes M=N, i.e., an N×N array.

One N×N array may store one weight operation, i.e., the weights stored in the synapse between the previous and subsequent layers of the artificial neural network.

The weight information of a synapse between layers L1 and L2 is stored in a first array at the bottom of FIG. 15. The feature map data of each node of the layer L1 is applied as an input signal VL1(i). The result of a MAC operation based on VL1(i) and the weight information of the synapse between the layers L1 and L2 may be transferred as the output signal VL2(j) of each row. The output signal VL2(j) may be transferred as the input signal of a second array at the top of FIG. 15. In the present embodiment, the input and output signals of the array are signals having the same physical dimension, i.e., voltage signals, and thus the result of the synapse operation between the preceding layers L1 and L2 may be applied as the input of a synapse operation between subsequent layers L2 and L3 without any special conversion process.

The weight information of a synapse between layers L2 and L3 is stored in a second array at the top of FIG. 15. The feature map data of each node of the layer L2 is applied to the second array as the input signal VL2(j). The result of the MAC operation based on VL2(j) and the weight information of the synapse between the layers L2-L3 may be transferred as the output signal VL3(k) of each row.

The present embodiment uses ΔV, i.e., a change in voltage or the amount of charge in the time domain, and thus does not require DC current. In addition, both the input and output signals of a synaptic array have the same physical dimension, and thus there is no need for a separate process of converting the output signal of a previous array to the input signal of a subsequent array. In other words, the result of the MAC operation of the previous array may be applied as the input signal of the subsequent array while maintaining the physical dimension.

The conventional neuromorphic systems that are contrasted with the present invention are generally based on a memristor scheme. The memristor scheme requires that an input signal is a voltage signal and an output signal is implemented as a current signal. In this case, in order to transfer a current signal, i.e., a result from one array, as an input signal of a subsequent array, a circuit for converting a current signal, i.e., an output result of a previous array, into a voltage signal is required. In general, in order to convert current into voltage, a voltage signal is formed by using a resistor R or by using a capacitor C (by charging voltage V by flowing current I to the capacitor C for a predetermined time). The resistor R and the capacitor C are elements requiring a large area in a semiconductor integrated circuit process, and the process of converting current into voltage by using the resistor R and the capacitor C is a high power-consuming operation.

In the present embodiment, the input signal is a voltage signal and the output signal is also a voltage signal, so that a circuit for transferring an output signal of one array as an input signal of a subsequent array is simple and an area and power consumption may be reduced.

For example, since the feature map data of L2, which is the result of an operation between layers L1 and L2, may be automatically transferred as an input signal of an operation between subsequent layers L2 and L3, a multilayer artificial neural network operation may be automatically implemented in sequential order in a neuromorphic system in the present embodiment.

FIG. 16 is a diagram showing an array of weight memory devices and a weight memory system according to an embodiment of the present invention.

FIG. 16 shows a weight memory system 1600 in which the weight memory systems 1500 of FIG. 15 are integrated through the three-dimensional stacking or three-dimensional packaging of memory cell arrays. Since the operations of a first array at the bottom of FIG. 16 and a second array at the top of FIG. 16 are the same as those of FIG. 15, redundant descriptions thereof will be omitted.

The feature map data VL2(j) of L2, which is an output of the first array, may be applied as an input of the second array. In this case, the output terminals of the first array and the input terminals of the second array may arranged on the same X-Y plane and connected by vias, through silicon vias (TSVs), wires, or electrodes connected in an Z-axis direction so that the output VL2(j) of the first array can be directly transferred as the input of the second array.

Each even-numbered array is configured such that input terminals are arranged in an X direction and output terminals are arranged in a Y direction, each odd-numbered array is configured such that input terminals are arranged in a Y direction and output terminals are arranged in an X direction, and the output terminals of one array may be connected to the input terminals of a subsequent array by vias, through silicon vias (TSVs), wires, or electrodes that extend in a Z direction.

In the case where an inference process is started in the state in which a weight dataset has been stored, when an input signal set is applied to an array first, subsequent processes may be seamlessly performed without intervention of other circuits. Due to this, it may be possible to accelerate the operation of an artificial neural network.

Figure 17:
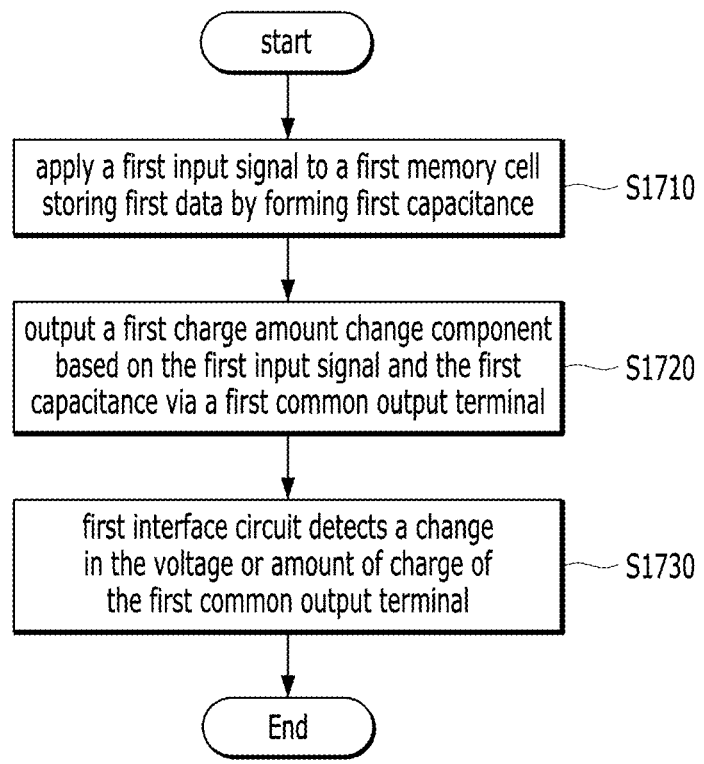
FIG. 17 is an operational flowchart showing a method of operating a weight memory device according to an embodiment of the present invention.

FIG. 17 is an operational flowchart showing a method of operating a weight memory device according to an embodiment of the present invention.

Referring to FIG. 17, the method of operating a weight memory device according to the present embodiment includes: step S1710 of applying a first input signal to a first memory cell via the input terminal of the first memory cell storing given first data by forming a first capacitance quantified based on the first data; step S1720 of outputting a first charge amount change component based on the first input signal and the first capacitance via the first common output terminal of the first memory cell; and step S1730 of detecting, by a first interface circuit, a change in the voltage or amount of charge of the first common output terminal.

Furthermore, the method according to the present embodiment may further include, before step S1710, the step (not shown) of presetting the voltage of the common output terminal. In the step of presetting the voltage of the common output terminal, the voltage between the common output terminal and the input terminal is optimized in a form suitable for a read process. As the voltage of the common output terminal is preset, an elaborate read process (steps S1710 to S1730) based on a change in the first capacitance may be performed.

In this case, the method according to the present embodiment may further include: the step of applying a second input signal to a second memory cell via the input terminal of the second memory cell storing given second data by forming a second capacitance quantified based on the second data; and the step of outputting a second charge amount change component based on the second input signal and the second capacitance via the first common output terminal of the second memory cell.

In this case, as the voltage of the common output terminal is preset for the second memory cell before applying the second input signal, a preparation process for an elaborate read operation may be performed in advance.

The first memory cell and the second memory cell are connected to the first common output terminal, and a sum output signal in which the first charge amount change component and the second charge amount change component are summed may be output to the common output terminal.

Step S1730 of detecting, by a first interface circuit, a change in the voltage or amount of charge of the first common output terminal is performed by detecting the sum output signal formed in the first common output terminal and also generating an output transfer signal via the first interface circuit.

The first input signal may be the activation parameter/feature map data of a first node, which is any one of the nodes of the first layer of an artificial neural network, and the first data may be a weight value between the first node and a second node, which is any one of the nodes of the second layer of the artificial neural network. The second input signal may be the activation parameter/feature map data of a third node, which is another one of the nodes of the first layer, and the second data may be a weight value between the third node and the second node.

The change in the voltage or amount of charge of the first common output terminal is a variance obtained by summing the products of the activation parameters of the nodes of the first layer and weight values corresponding to the synapses between the nodes (including the first node and the third node) of the first layer and the second node. Based on this, the activation parameter/feature map data of the second node may be derived through a nonlinear transfer function.

Figure 18:
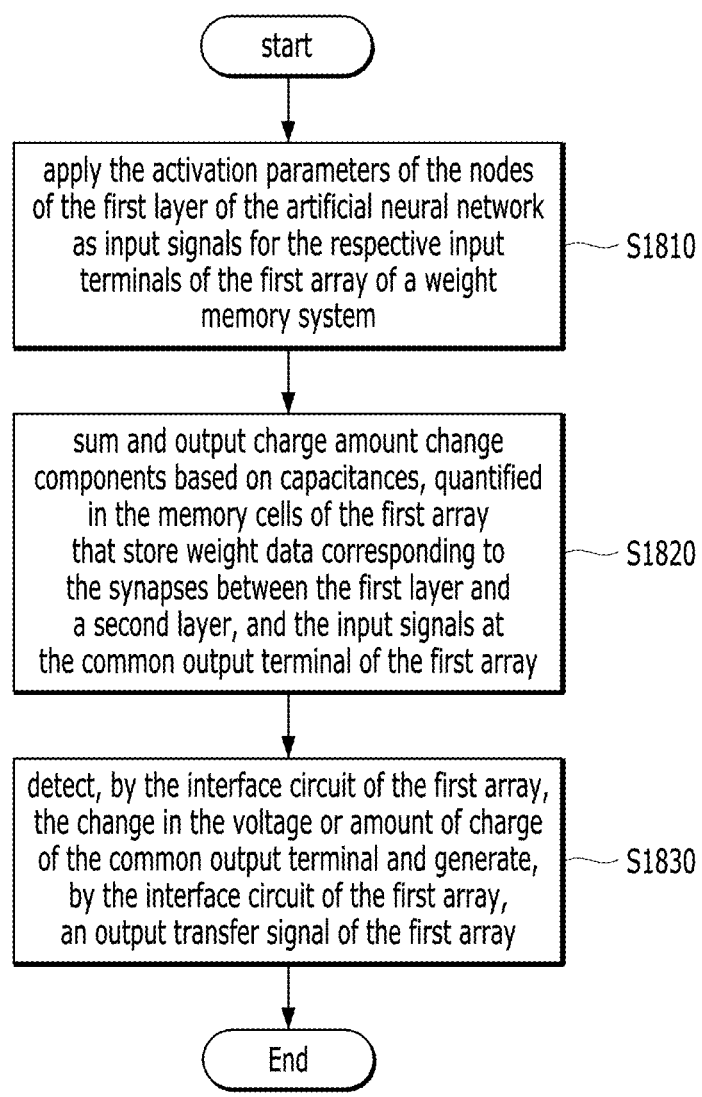
FIG. 18 is an operational flowchart showing a method of operating a weight memory system according to an embodiment of the present invention.

FIG. 18 is an operational flowchart showing a method of operating a weight memory system according to an embodiment of the present invention.

Referring to FIG. 18, the method according to the present embodiment includes: step S1810 of applying the activation parameters of the nodes of the first layer of the artificial neural network as input signals for the respective input terminals of the first array of a weight memory system; step S1820 of applying the input signals for the respective input terminals of the first array to memory cells in the first array that store weight data by forming capacitances quantified based on the weight data corresponding to synapses between the first layer of the first array and the second layer of the artificial neural network, summing charge amount change components based on the input signals and the capacitances in the common output terminal of the first array, and then causing a change in the voltage or amount of charge of the common output terminal; and step S1830 of detecting, by the interface circuit of the first array, a change in the voltage or amount of charge of the common output terminal and generating, by the interface circuit of the first array, output transfer signals of the first array. In this case, the output transfer signals are the activation parameters of the respective nodes of the second layer.

Furthermore, the method according to the present embodiment may further include the step (not shown) of presetting the terminal voltages of the respective memory cells of the first array in which an artificial neural network operation between the first layer and the second layer will be performed. In the step of presetting the terminal voltages of the respective memory cells of the first array, preparation for the performance of an operation is performed. Due to this, when input signals are applied, an elaborate read operation based on the input signals and capacitances may be implemented.

The method according to the present embodiment may further include the step of applying the output transfer signals, which are the activation parameters of the nodes of the second layer of the artificial neural network, as input signals for the input terminals of the second array of the weight memory system.

In this case, the step of applying the output transfer signals as input signals for the input terminals of the second array may include applying the output transfer signals as input signals for the respective input terminals of the second array while maintaining the physical dimension of the output transfer signals. In the present embodiment, the output transmission signals of a previous array and the input signals of a subsequent array are both voltages, and thus a conversion process is not required. When there are two or more arrays, output signals of a first array may be transferred as input signals of a second array, which is a subsequent array. In this case, a common output signal of the common output terminal of the first array may be transmitted as each input signal of the subsequent second array.

The step (not shown) of presetting the terminal voltages of the respective memory cells of the second array before applying the input signals may be performed for the second array in advance. For example, (L-1) arrays may be required for artificial neural network operations between L layers. Preparation for an elaborate read process may be made by presetting all the terminal voltages of the memory cells of the (L-1) arrays. Thereafter, when an input signal is applied to the first array, an input signal of the second array is generated through an elaborate read process, the input signal is input to the second array after a minimum time delay, and this process is repeated. As a result, the output of a last (L-1)-th array may be generated as the activation parameter/feature map data of an L-th layer. The time delay that occurs when the output signal of each array is applied as the input signal of a subsequent array may be minimized because the input signal and the output signal are the same physical quantity. The terminal voltages of the respective memory cells of all the arrays are preset, and thus an elaborate read process may be performed serially from one array to a subsequent array.

Figure 19:
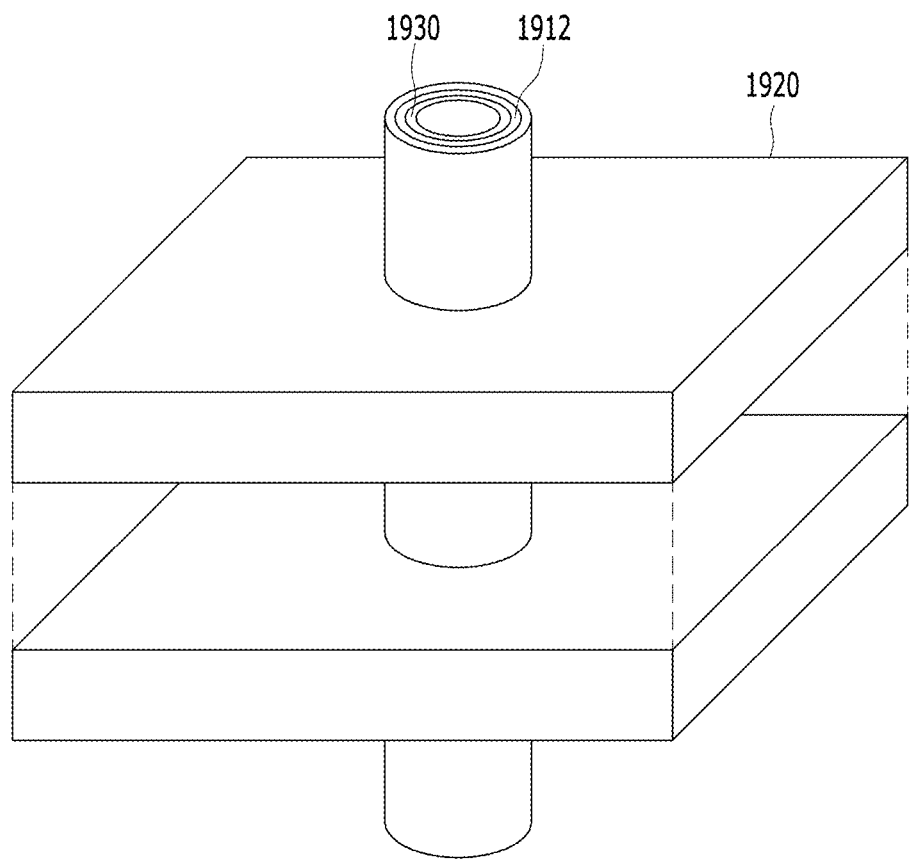
FIG. 19 is a perspective view showing a weight memory device according to an embodiment of the present invention.

FIG. 19 is a perspective view showing a weight memory device according to an embodiment of the present invention.

Referring to FIG. 19, the weight memory device is a three-dimensional memory device, and an input terminal 1930 is formed in a body including a conductive region and a dielectric while vertically extending on a substrate. The weight memory device of FIG. 19 may be implemented by modifying a generally known 3D NAND flash memory structure. For example, the vertically extending body may be shaped in the form of a cylinder, insulators may be disposed through the center of a circle inside the cylinder, and a channel layer may be formed between the insulators. The insulator, the channel layer, the insulator, charge storage 1912, and an insulator may be arranged in a direction from the center of the circle. The weight memory device may be implemented in a shape in which at least part of the vertically extending body is surrounded by a control gate electrode that is the common output terminal 1920.

In another embodiment of the present invention derived by applying the embodiment of FIG. 13 preceding FIG. 19, there may be derived an embodiment in which an input terminal and a common output terminal are interchanged.

The weight memory devices of the present invention may have a structure similar to that of conventional 3D NAND flash memory cells. Meanwhile, as described above, the weight memory devices of the present invention may be implemented using a variety of new memory devices that have been recently proposed, e.g., memory cells having a cross-point structure, as long as they have the characteristic of changing the capacitance between two terminals.

The operation method according to an embodiment of the present invention may be implemented in the form of program instructions, and may be then recorded in a computer-readable storage medium. The computer-readable storage medium may include program instructions, data files, and data structures solely or in combination. Program instructions recorded on the storage medium may have been specially designed and configured for the present invention, or may be known to or available to those who have ordinary knowledge in the field of computer software. Examples of the computer-readable storage medium include all types of hardware devices specially configured to record and execute program instructions, such as magnetic media, such as a hard disk, a floppy disk, and magnetic tape, optical media, such as compact disk (CD)-read only memory (ROM) and a digital versatile disk (DVD), magneto-optical media, such as a floptical disk, ROM, random access memory (RAM), and flash memory. Examples of the program instructions include machine code, such as code created by a compiler, and high-level language code executable by a computer using an interpreter. These hardware devices may be configured to operate as one or more software modules in order to perform the operation of the present invention, and the vice versa.

According to the present invention, there may be implemented a neuromorphic device, a weight memory device, a weight memory system, and operation methods that are optimized for artificial neural network operation by changing the structure of cells and operation methods while utilizing the conventional memory semiconductor process.

According to the present invention, it may be possible to reduce power consumption without requiring continuous DC current during a read operation of a neuromorphic system by using the detection of a voltage difference, unlike the conventional technologies based on current, when outputting data of a weight memory cell.

According to the present invention, there may be implemented a memory cell structure that supports built-in MAC operation capable of performing inter-layer propagation operation using weight values generated in artificial neural network operation at low cost in an array of memory cells that store weight values of synapses. According to the present invention, there may be implemented a weight memory structure that is optimized for artificial neural network operation capable of performing MAC operation immediately without a separate operation circuit.

According to the present invention, the optimization and stabilization of a process of manufacturing a weight memory device is facilitated and also the degree of integration is significantly increased by utilizing at least part of the conventional memory semiconductor process. According to the present invention, the area occupied by a circuit for reading data stored in a weight memory device in response to an artificial neural network operation is reduced and the configuration of the data reading circuit is simplified, thereby increasing the overall degree of integration of a system including the array.

According to the present invention, there may be implemented a neuromorphic system that is capable of increasing the overall degree of integration of a system including an array and also performing artificial neural network operation rapidly through the three-dimensional stacking of weight memory cell arrays. In addition, According to the present invention, there may be implemented a new neuromorphic system that can easily implement the transfer characteristics of a data reading circuit in accordance with an inter-layer transfer function within an artificial neural network and can easily deal with the configurations of various artificial neural networks including a convolutional neural network (CNN) and a circulating neural network (RNN).

According to the present invention, there may be implemented a neuromorphic system that is capable of readjusting a stored weight value by applying a bias between the terminals of a weight memory cell device for a predetermined period or by adjusting the polarity and number of pulses, and accordingly being applied to a wide application range including not only an inference process but also a learning process.

The present invention may utilize at least part of the conventional memory semiconductor process, so that the optimization and stabilization of a process of manufacturing a weight memory device is facilitated and also the degree of integration is significantly increased. In addition, the reset of a stored weight value may be easily achieved by applying a bias having a polarity opposite to that during storage between a gate electrode and a well for a predetermined period. Accordingly, write, read, and erase (reset) processes may all be easily implemented. As a result, an advantage arises in that that the present invention may easily deal with the configurations of various artificial neural networks, such as a convolutional neural network (CNN) and a recurrent neural network (RNN).

However, the present invention is not limited to the embodiments. Like reference symbols in the drawings designate like components. The lengths, heights, sizes, widths, etc. introduced in the embodiments and drawings of the present invention may be exaggerated to help to understand.

The present invention was derived from the research conducted as part of the New device original technology development Project sponsored by the Ministry of Science and ICT and National Research Foundation of Korea [Project Management Number: NRF2020M3F3A2A0108165611; Project Name: Silicon Flash-based charge storage type synaptic devices and arrays for High-Reliability neuromorphic systems].

Although the present invention has been described with reference to specific details such as the specific components, and the limited embodiments and drawings, these are provided merely to help a general understanding of the present invention, and the present invention is not limited thereto. Furthermore, those having ordinary skill in the technical field to which the present invention pertains may make various modifications and variations from the above detailed description.

Therefore, the spirit of the present invention should not be defined based only on the described embodiments, and not only the attached claims but also all equivalent to the claims should be construed as falling within the scope of the spirit of the present invention.

What is claimed is:

1. A weight memory device comprising:
    an input terminal;
    a common output terminal; and
    charge storage disposed between the input terminal and the common output terminal, and configured to store charge;
    wherein a capacitance between the input terminal and the common output terminal is determined based on an amount of charge stored in the charge storage, and is quantified based on given data to be stored in the weight memory device.

2. The weight memory device of claim 1, wherein the common output terminal is electrically connected to an interface circuit configured to drive and control a voltage of the common output terminal via a switch, and, when the common output terminal and the interface circuit are electrically cut off from each other by the switch, is electrically isolated without being electrically connected to an intended charge leakage path.

3. The weight memory device of claim 1, wherein the charge storage comprises:
    a first dielectric layer disposed adjacent to the common output terminal;
    a second dielectric layer disposed adjacent to the input terminal; and
    a storage layer disposed between the first dielectric layer and the second dielectric layer, and made of one of a conductor, a semiconductor, and a dielectric capable of storing electrons or charges therein.

4. The weight memory device of claim 1, wherein each of the input terminal and the common output terminal is at least one of a well disposed on a substrate, a semiconductor wire, an oxide semiconductor wire, and a metal wire, wherein the semiconductor wire may include a polysilicon wire.

5. The weight memory device of claim 1, wherein:
    the input terminal is at least one of a well disposed on a substrate, a semiconductor, an oxide semiconductor, and a metal, wherein the semiconductor may include polysilicon; and
    the common output terminal is at least one of a semiconductor wire, an oxide semiconductor wire, and a metal wire, wherein the semiconductor wire may include a polysilicon.

6. The weight memory device of claim 1, wherein:
    a first bias voltage applied between the input terminal and the common output terminal and a length of a time period during which the first bias voltage is applied are determined based on the given data; and an amount of charge to be stored in the charge storage varies depending on the first bias voltage and the length of the time period during which the first bias voltage is applied, and capacitance-voltage characteristics between the common output terminal and the input terminal are determined based on the amount of charge stored in the charge storage.

7. The weight memory device of claim 1, wherein:
the capacitance between the input terminal and the common output terminal is quantified based on capacitance-voltage characteristics between the common output terminal and the input terminal and based on a second bias voltage in a state in which the second bias voltage has been applied between the input terminal and the common output terminal; and
when an input signal is applied to the input terminal in the state in which the second bias voltage has been applied, a change in a voltage or amount of charge of the common output terminal is generated as an output signal of the common output terminal based on the capacitance between the input terminal and the common output terminal and the input signal.

8. The weight memory device of claim 3, wherein the input terminal is one of a well disposed on a substrate and a deposited semiconductor wire, the common output terminal is a gate terminal, and an amount of charge to be stored in the charge storage is determined in such a manner that electrons are trapped in the charge storage when a first bias voltage is applied between the input terminal and the common output terminal.

9. The weight memory device of claim 8, further comprising a drain/source region disposed on a partial region of the well disposed on the substrate or the deposited semiconductor wire and configured to provide an auxiliary bias condition.

10. The weight memory device of claim 9, wherein the auxiliary bias condition provided by the drain/source region is configured to supply electrons or holes to a surface of one of another partial region of the input terminal facing the common output terminal and another partial region of the common output terminal facing the input terminal so that when a second bias voltage is applied between the input terminal and the common output terminal, an output signal of the common output terminal based on capacitance-voltage characteristics between the common output terminal and the input terminal is generated in response to an input signal of the input terminal.

11. The weight memory device of claim 9, wherein the auxiliary bias condition provided by the drain/source region is configured to block formation of an electron layer or a hole layer on an interface of one of another partial region of the input terminal facing the common output terminal and another partial region of the common output terminal facing the input terminal so that when a first bias voltage or a second bias voltage is applied between the input terminal and the common output terminal, an output signal of the common output terminal based on capacitance-voltage characteristics between the common output terminal and the input terminal is generated in response to an input signal of the input terminal.

12. The weight memory device of claim 1, wherein:
the weight memory device is a three-dimensional memory device;
one of the input terminal and the common output terminal is formed in a body that vertically extends on a substrate and includes a conductive region and a dielectric;
a remaining one of the input terminal and the common output terminal is a control gate terminal that surrounds at least part of the body; and
the charge storage is disposed between the body and the control gate terminal to store charge.

13. A weight memory system comprising:
a first electrode arranged in a first direction, and configured to connect a common output terminal of memory cells which are arranged in the first direction from among a plurality of memory cells;
a second electrode arranged in a second direction different from the first direction, and configured to connect input terminals of memory cells which are arranged in the second direction from among the plurality of memory cells;
a first memory cell disposed to correspond to a location at which the first electrode and the second electrode intersect each other, specified by intersection of the first electrode and the second electrode, and configured such that the first electrode is connected to a first common output terminal thereof and the second electrode is connected to a first input terminal thereof;
a first interface circuit configured to:
drive and control a voltage of the first electrode; or
sense a change in a voltage or amount of charge of the first electrode and generate an output transfer signal; and
a first driving circuit configured to drive and control a voltage of the second electrode;
wherein the first memory cell comprises charge storage disposed between the first input terminal and the first common output terminal and configured to store charge; and
wherein a first capacitance between the first input terminal and the first common output terminal is determined based on an amount of charge stored in the charge storage, and is quantified based on first data given to the first memory cell to be stored in the first memory cell.

14. The weight memory system of claim 13, wherein when the first interface circuit and the first electrode are electrically cut off from each other by an operation of the first interface circuit, the first electrode is electrically isolated without being electrically connected to an intended charge leakage path.

15. The weight memory system of claim 13, wherein when a first input signal is applied to the first input terminal via the second electrode by the first driving circuit, a first output signal component based on the first input signal and the first capacitance is output to the first electrode via the common output terminal.

16. The weight memory system of claim 13, further comprising:
a second memory cell connected to the first electrode via a second common output terminal thereof;
a third electrode connected to a second input terminal of the second memory cell, and arranged in the second direction; and
a second driving circuit configured to drive and control a voltage of the third electrode;
wherein the second memory cell is disposed to correspond to a location at which the first electrode and the third electrode intersect each other, and is specified by intersection of the first electrode and the third electrode;
wherein a second capacitance of the second memory cell is quantified based on second data given to the second memory cell to be stored in the second memory cell;

wherein when a second input signal is applied to the second input terminal via the third electrode by the second driving circuit, a second output signal component based on the second input signal and the second capacitance is output to the first electrode via the common output terminal; and wherein a sum output signal in which the first output signal component and the second output signal component are summed is output to the first electrode, and the first interface circuit detects the sum output signal and generates the output transfer signal.

17. The weight memory system of claim 16, wherein when the first input signal is a change in a voltage of the input terminal, the first output signal component is a first charge amount change component, and the first output signal component contributes to the change in the voltage or amount of charge of the first electrode via the common output terminal.

18. The weight memory system of claim 16, wherein the first input signal and the output transfer signal have a same physical dimension.

19. The weight memory system of claim 16, wherein:

a first memory array including the first memory cell stores information corresponding to a synapse between first layer and second layer of an artificial neural network;

a second memory array stores information corresponding to a synapse between the second layer and a third layer of the artificial neural network; and output transfer signals of the first memory array are applied as input signals of the second memory array while maintaining a physical dimension.

* * * * *